(12) United States Patent
Yamashita et al.

(10) Patent No.: US 6,339,321 B1
(45) Date of Patent: Jan. 15, 2002

(54) ELECTRONIC DEVICE TRAY ELECTRONIC DEVICE TRAY, TRANSPORTING APPARATUS, AND ELECTRONIC DEVICE TESTING APPARATUS

(75) Inventors: Kazuyuki Yamashita; Hiroto Nakamura; Shin Nemoto, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/320,691

(22) Filed: May 27, 1999

(30) Foreign Application Priority Data

| May 29, 1998 | (JP) | ............................................ | 10-150051 |
| Sep. 2, 1998 | (JP) | ............................................ | 10-248215 |
| Apr. 14, 1999 | (JP) | ............................................ | 11-106155 |

(51) Int. Cl.$^7$ ................................................. G01R 1/04
(52) U.S. Cl. ..................................... 324/158.1; 324/755
(58) Field of Search ............................. 324/158.1, 754, 324/755, 758, 760; 209/571, 2; 220/287; 206/725, 724

(56) References Cited

U.S. PATENT DOCUMENTS

| 4,040,518 | A | * | 8/1977 | Carter | ........................ | 206/387 |
| 4,782,995 | A | * | 11/1988 | Emery et al. | .......... | 229/2.5 EC |
| 5,159,973 | A | * | 11/1992 | Pennington et al. | ....... | 165/48.1 |
| 5,184,068 | A | * | 2/1993 | Twigg et al. | ................ | 324/755 |
| 5,313,156 | A | * | 5/1994 | Klug et al. | ................. | 324/754 |
| 5,418,692 | A | * | 5/1995 | Nemoto | ....................... | 361/809 |
| 5,596,282 | A | * | 1/1997 | Giddings et al. | ........... | 324/754 |
| 5,650,732 | A | * | 7/1997 | Sakai | ......................... | 324/755 |
| 5,667,077 | A | * | 9/1997 | Goins, III | ............... | 324/73.1 X |
| 5,801,527 | A | * | 9/1998 | Ishii et al. | ................ | 324/158.1 |
| 5,848,702 | A | * | 12/1998 | Pakeriasamy | ............... | 206/725 |
| 5,857,573 | A | * | 1/1999 | Pakeriasamy | ............... | 206/723 |
| 5,954,205 | A | * | 9/1999 | Smith | ............................ | 209/2 |
| 6,109,445 | A | * | 8/2000 | Beyer | ........................ | 206/714 |

\* cited by examiner

Primary Examiner—Safet Metjahic
Assistant Examiner—T. R. Sundaram
(74) Attorney, Agent, or Firm—Birch, Stewart, Kolasch & Birch, LLP

(57) ABSTRACT

An electronic device tray 110 having a plurality of IC holders 14 in which IC chips are held and having a shutter 15 for opening and closing openings of the IC holders 14, the shutter 15 being opened and closed by fluid pressure cylinders etc. provided at an IC tester. Further, a tray vertical carrier 350 for conveying a tray 110 holding IC chips in a substantially vertical direction, including a tray end holding member 310 able to detachably hold an end of the lowermost level tray 110 positioned at the lowermost level among stacked trays 110, a tray elevating member 310 for conveying the lowermost level tray 110 downward or upward, an actuator member 312 for driving the tray end holding member 310 so as to release the hold on the lowermost level tray and then hold the end of another tray 110 next arriving at the lowermost level position when the lowermost level tray 110 is in a state where it can be supported by the tray elevating member 314, and a tray horizontal carrier 320 receiving the lowermost level tray 110 when the tray elevating member 314 descends and able to move in the substantially horizontal direction, the tray horizontal carrier 320 being moved by a drive wire 330.

28 Claims, 25 Drawing Sheets

ELECTRONIC DEVICE TRAY ELECTRONIC DEVICE TRAY, TRANSPORTING APPARATUS, AND ELECTRONIC DEVICE TESTING APPARATUS

BACKGROUND OF THE INVENTION

1. Field of the Invention

The present invention relates to an electronic device tray, an electronic device tray transporting apparatus, and an electronic device testing apparatus, more particular relates to an electronic device tray and electronic device tray transporting apparatus suitable for holding and conveying integrated circuit (IC) chips and other electronic devices for testing the electronic devices and to an electronic device testing apparatus having such a tray or tray carrier.

2. Description of the Related Art

In the process of production of semiconductor devices etc., a tester for testing the finally produced IC chips and other electronic devices becomes necessary. In such a tester, a large number of IC chips carried on a tray are picked up by a suction apparatus and conveyed to over a test head of the tester. Each IC chip is brought into electrical contact with the test head for testing the IC chip. When the test is completed, the IC chips are conveyed out from the test head by a suction apparatus having suction pads and reloaded on trays in accordance with the results of the test so as to sort them into categories such as good chips and defective chips.

In this kind of tester, there is a type which is provided with trays for conveying the IC chips circulating in the tester (hereinafter referred to as "test trays") in addition to the trays for holding the pre-test IC chips and holding the post-test IC chips (hereinafter referred to as "customer trays"). In this type of tester, the IC chips are reloaded between customer trays and test trays before and after testing, a plurality of IC chips are conveyed inside the tester in the state loaded on test trays, and the IC chips are protected during conveyance.

In this type of tester, since the plurality of IC chips are conveyed inside the tester in a state loaded on test trays, restraining mechanisms are provided for preventing them from jumping out from the test tray due to vibration or shock during conveyance (for example, see FIG. 7 of Japanese Unexamined Patent Publication (Kokai) No. 9-43309).

In the tester of the related art, however, since restraining mechanisms are provided to hold each and every IC chip, the exact same number of restraining mechanisms as the IC chips becomes necessary. Not only is there a problem cost-wise, but also use of the same mechanisms is difficult when the ICs are different in shape. In this sense as well, the restraining mechanisms had to be specially designed.

There is also known a tester which covers the area above the test head by a chamber section to create an air-tight space inside, conveys the IC chips above the test head and there pushes the IC chips against the test head for connection, then tests them while making the inside of the chamber section a high temperature or low temperature state.

In this type of tester, the test trays are successively made to move in the substantially vertical direction inside the chamber section and thermal stress is applied gradually to the IC chips attached to the test trays. The test trays are made to move in the substantially vertical direction to gradually apply thermal stress to the IC chips since arrangement of a plurality of test trays in the substantially vertical direction helps make the chamber section compact.

In the tester of the related art, as a tray carrier for making the test trays move in the substantially vertical direction, use is made of a vertical carrier which detachably holds all of the trays arranged in the substantially vertical direction by separate holding members and makes them move successively downward one level at a time in the vertical direction.

In the tray vertical carrier in the tester of this related art, however, since the mechanism holds each of the trays in the vertical direction and makes them move successively downward, there is the problem that the mechanism becomes complicated. Further, the time required for a tray to be moved from the uppermost level holding member to the lowermost level holding member corresponded to the number of levels. There was the problem that even when the number of trays arranged in the vertical direction was small, the same amount of time was taken as when there were a large number of trays. Further, there was also the problem that it was not possible to increase the operating speed of the mechanism due to the design of the tray vertical carrier of the related art.

Further, inside the chamber section of the tester, it is necessary to not only make the test trays move in the substantially vertical direction, but also make them move in the substantially horizontal direction. A tray horizontal carrier is therefore also provided inside the chamber section.

The tray horizontal carrier of the related art, however, made the trays move in the horizontal direction by a belt conveyor system, so there was a problem in the mechanism for making the trays stop at predetermined positions. For example, in the tray horizontal carrier of the belt conveyor system of the related art, to make a tray stop at a predetermined position, a stopper member was made to abut against the tray conveyed by the belt conveyor to make the tray stop, the stopped tray was detected by a position sensor etc., then the belt conveyor was made to stop. Next, when making the tray move to another position, the stopper member was retracted, then the belt conveyor was driven, and, in the same way as explained above, a stopper member was used to make the tray stop at another stopping position.

Therefore, a stopper member and sensor became necessary for every one of the plurality of stopping positions. Further, an actuator member for driving the stopper members was required. The mechanism therefore become complicated. Further, since a tray was made to abut against a stopper member to make the tray stop, a shock was given to the tray due to its striking the member, the trays would slip against the belt until the conveyor was stopped, and trouble such as wear of the trays and belt would occur. Further, since a tray was made to strike a stopper member to stop it, the stopping position easily would become deviated and a mechanism for positioning the tray had to be separately provided.

SUMMARY OF THE INVENTION

A first object of the present invention is to provide an electronic device tray for conveying for example an IC chip or another electronic device and having a particularly simple structure of a restraining mechanism.

A second object of the present invention is to provide an electronic device tray, an electronic device tray transporting apparatus, and an electronic device testing apparatus which, when a tray for conveying IC chips and other electronic devices is conveyed in the substantially vertical direction, are simple in mechanism, fast in operating speed, and enable a tray to be moved particularly quickly in the substantially vertical direction when there is a small number of trays.

A third object of the present invention is to provide an electronic device tray transporting apparatus and an electronic device testing apparatus which, when a tray for conveying IC chips or other electronic devices is conveyed in a substantially horizontal direction, use relatively simple mechanisms to easily make the tray accurately stop at a predetermined position, reduce the load acting on the tray, and suffer from less trouble.

A fourth object of the present invention is to provide an in-chamber member movement mechanism, and an electronic device testing apparatus using the same, which can easily make a tray carrier or other in-chamber movement member accurately stop at a predetermined stopping position by a relatively simple mechanism, reduce the load acting on the movement member, and suffer from less trouble, in particular an in-chamber member movement mechanism, and an electronic device testing apparatus using the same, which can effectively prevent condensation when holding the inside of the chamber section in a low temperature state.

To achieve the first object of the present invention, according to a first aspect of the present invention, there is provided an electronic device tray comprising a tray body provided with a holder in which an electronic device under test is held and a shutter attached movably with respect to the tray body for opening and closing an opening of the holder.

In the electronic device tray according to the first aspect of the present invention, a shutter for opening and closing the opening of the holder is provided. When carrying and conveying an electronic device under test, the shutter is closed, while when reloading the electronic device under test, the shutter is opened. Therefore, the electronic device under test is prevented from jumping out during conveyance. Further, since the shutter does not have to be provided for each holder and may be provided commonly for at least several holders, the restraining mechanism of the electronic devices becomes streamlined and the cost can be reduced. Further, in this electronic device tray, since the shutter slides with respect to the tray body to prevent an electronic device under test from jumping out, there is no need to change the shutter even if the electronic devices under test differ in shape and consequently the shutter can be made more general in use.

Note that one shutter is most preferably provided for one electronic device tray, but it is also possible to divide the holders into several groups and provide a shutter for each group.

The electronic device tray of the present invention preferably further has a spring or other elastic member imparting a biasing force to the shutter in the direction closing the opening of the holder. In particular, if such elastic members are provided at both ends of the shutter, the balance of the shutter at the time of opening or closing becomes good and the shutter can be easily opened or closed by gripping just its center.

The shutter preferably is provided with an engagement portion for engagement with an operating mechanism provided separately from the electronic device tray so as to make the shutter move with respect to the holder and open or close the opening.

The shutter preferably is attached to be able to freely slide with respect to the tray body in the substantially perpendicular direction with respect to the longitudinal direction of the shutter by a center guide member arranged at the substantially center position of the shutter in the longitudinal direction.

Preferably side guide members for guiding the sliding movement of the shutter in the substantially perpendicular direction with respect to the longitudinal direction are provided at the two end positions of the shutter in the longitudinal direction and the clearance between the center guide member and the shutter is smaller than the clearance between a side guide member and the shutter.

The electronic device tray is sometimes subjected to a high temperature or a low temperature and the resultant thermal stress makes the tray body and the shutter expand or contract. In this electronic device tray, however, since the shutter is supported to be able to freely slide by the center guide member at the substantially center position of the tray body in the longitudinal direction, even if the shutter expands or contracts due to heat, the expansion or contraction is distributed to the two ends from the center guide member. Therefore, the dimensional error due to the thermal expansion or thermal contraction, even at the maximum, becomes half of that of the case where the shutter is supported at only one side and thereby it is possible to reduce the error due to thermal expansion or the error due to thermal contraction between the tray body and the shutter.

Preferably a sliding member reducing the friction when the shutter slides with respect to the tray body is provided between the shutter and the tray body.

By providing a sliding member between the tray body and the shutter, interference between the shutter and the tray body at the time of the opening or closing of the shutter is prevented, a smooth opening/closing operation becomes possible, and there is no longer damage to one or the other. Even if the sliding member becomes worn, since it is sufficient to replace only the sliding member, the lifetime of the electronic device tray becomes lengthened.

The tray body is preferably formed with a positioning hole for engagement with a positioning pin provided separately from the electronic device tray. The positioning pin is for example provided on a suction head for picking up an electronic device from the tray. The positioning hole is preferably provided detachably with an intermediary member of a hardness lower than that of the positioning pin. Note that it is also possible not to provide the intermediary member in the positioning hole, but to attach the intermediary member at the positioning pin.

The engagement between the positioning pin and the positioning hole results in the contact surfaces of the two becoming worn and thereby a reduction in the positioning accuracy, but it is possible to make the wear occur at an intermediary member by providing an intermediary member of a low hardness at either the positioning pin or positioning hole and thereby possible to prevent wear of the positioning pin and positioning hole. Further, since the intermediary member is provided detachably, when it becomes worn to a certain extent, it is sufficient to replace just the intermediary member.

The holder is preferably defined by at least two blocks of the same shape attached to the tray body in a detachable manner. By using blocks of the same shape, it is possible to reduce the types of parts making up the electronic device tray.

It is preferable to make the shape of the holder variable by changing the position of attachment of the blocks to the tray body. Even if electronic devices under test differ in shape, the same blocks can be used in common, universality can be imparted to the parts, and costs can be reduced.

Preferably a guide portion for positioning the input-output terminals of the electronic device under test is provided at the bottom of the holder.

For example, with a ball grid array (BGA) type IC chip of a chip size package (CSP), the dimensional accuracy of the outer periphery of the package mold is extremely rough and the accuracy of positioning of the outer circumferential shape and the solder balls is not necessarily guaranteed. Therefore, if positioning in the holder using the outer periphery of the IC package, the solder balls are liable to be pressed against the contact pins in the measurement portion in an offset state.

In the present invention, however, since a guide means for positioning with respect to the input-output terminals of the electronic device under test is provided at the holder, it is possible to directly position the input-output terminals and ensure the dimensional accuracy with the contact pins etc.

The holder is preferably formed with the through portion through which the detection light for detection of the presence of an electronic device under test may pass. By doing this, it is possible to detect if there is an electronic device at a holder after reloading the electronic devices under test. The "through portion" referred to here is a broad concept including holes, cutaway portions, and other various shapes and structures.

The through portion is preferably provided at the tray body and/or shutter. By providing the through portion at each of the tray body and the shutter, it is possible to detect the presence of an electronic device under test in a short time using the idle time such as when an electronic device tray with a closed shutter is being moved.

According to a second aspect of the present invention, there is provided an electronic device tray for conveying an electronic device under test having either of a positioning pin or a positioning hole and having provided detachably at either of the positioning pin or positioning hole an intermediary member of a hardness lower than that of the other.

In general, the engagement between the positioning pin and the positioning hole results in the contact surfaces of the two becoming worn and thereby a reduction in the positioning accuracy, but in the present invention it is possible to prevent the wear of the positioning pin and positioning hole by providing an intermediary member of a low hardness at either the positioning pin or positioning hole. Further, since the intermediary member is provided detachably, when it becomes worn to a certain extent, it is sufficient to replace just the intermediary member.

According to a third aspect of the present invention, there is provided an electronic device tray having at least one holder accommodating an electronic device, wherein a projection enabling the tray to be stacked in the substantially vertical direction at predetermined intervals is provided at the top surface or bottom surface of the tray.

The electronic device tray is preferably provided with a shutter for opening and closing an opening of the holder.

When stacking electronic device trays in the substantially vertical direction, predetermined spaces are formed between the trays. As a result, when arranging the trays in the chamber section, the high temperature or low temperature of the atmosphere in the chamber section is conducted well to the trays and the trays can be easily set to uniform temperatures.

To achieve the second object of the present invention, there is provided a carrier for an electronic device tray according to the first aspect of the present invention for conveying a tray holding at least one electronic device in a substantially vertical direction, comprising a tray end holding member able to detachably hold an end of the lowermost level tray positioned at the lowermost level among stacked trays; a tray elevating member abutting against the bottom surface of the lowermost level tray and conveying the lowermost level tray downward or upward; and an actuator member for driving the tray end holding member So as to release the hold on the lowermost level tray by the tray end holding member and hold the end of another tray next arriving at the lowermost level position when the tray elevating member abuts against the bottom surface of the lowermost level tray and the lowermost level tray becomes supportable by the tray elevating member.

In the present invention, the actuator member is not particularly limited, but for example an air cylinder or other pressure cylinder, electromagnetic drive actuator, piezoelectric drive actuator, motor actuator, etc. may be mentioned.

The electronic device tray transporting apparatus preferably further is provided with a tray horizontal carrier arranged below the tray end holding member so as not to interfere with the elevating movement of the tray elevating member, receiving the lowermost level tray when the tray elevating member descends, and able to move the same in the substantially horizontal direction.

Note that in the present invention, the "substantially vertical direction" means not only the vertical direction in the strict sense of the term, but also cases of some inclination from the vertical direction. Further, similarly, the "substantially horizontal direction" means not only the horizontal direction in the strict sense of the term, but also cases of some inclination from the horizontal direction.

The electronic device tray transporting apparatus preferably further is provided with a rail holding the tray horizontal carrier movably in the substantially horizontal direction.

The electronic device tray transporting apparatus preferably further is provided with a drive wire connected to the tray horizontal carrier and making it move along the longitudinal direction to make the tray horizontal carrier move in the substantially horizontal direction.

The electronic device tray transporting apparatus preferably is further provided with a drive motor for winding up or unwinding the drive wire to make the tray horizontal carrier move along the substantially horizontal direction by the drive wire.

In the electronic device tray transporting apparatus according to the first aspect of the present invention, the trays are successively stacked on the lowermost level tray held by the tray end holding member. Unlike in the related art, each of the stacked trays is not held by a tray end holding member. Therefore, when there is a small number of trays to be stacked, only the lowermost level tray among the small number of stacked trays is held by the tray end holding member.

The bottom surface of the lowermost level tray among the stacked trays abuts against the tray elevating member. When the lowermost level tray can be supported by the tray elevating member, the tray end holding member is driven by the actuator member to release the hold on the lowermost level tray by the tray end holding member. Further, by again driving the tray end holding member by the actuator member, the tray end holding member holds the end of another tray next arriving at the lowermost level position.

The lowermost level tray held by the tray elevating member is conveyed downward or upward by the tray elevating member and for example is placed on the tray horizontal carrier and conveyed in the substantially horizontal direction. By doing this, the trays positioned at the lowermost level among the stacked trays are successively conveyed by the tray vertical carrier. Accordingly, when there is a small number of stacked trays, a tray is conveyed from the uppermost level to the lowermost level in a waiting time of just the time corresponding to the number of stacked trays.

Note that in the related art, since the trays were made to descend for each level of the tray end holding members without regard as to the actual number of trays, a waiting time corresponding to the number of levels of the tray end holding members was required and consequently time was taken. In the electronic device tray transporting apparatus according to the first aspect of the present invention, since the mechanism is simple, the operating speed is fast.

To achieve the third object of the present invention, the electronic device tray transporting apparatus according to the second aspect of the present invention is provided with a tray horizontal carrier for conveying a tray holding at least one electronic device in the substantially horizontal direction and a drive wire connected to the tray horizontal carrier and making it move along the longitudinal direction to make the tray horizontal carrier move in the substantially horizontal direction.

The electronic device tray transporting apparatus preferably is further provided with a rail for holding the tray horizontal carrier movably in the substantially horizontal direction.

The electronic device tray transporting apparatus preferably is further provided with a drive motor for winding up or unwinding the drive wire to make the tray horizontal carrier move along the substantially horizontal direction by the drive wire.

In the electronic device tray transporting apparatus according to the second aspect of the present invention, since the tray horizontal carrier is conveyed in the substantially horizontal direction by the drive wire, it is possible to make the tray horizontal carrier stop at the accurate position by controlling the amount of movement of the drive wire in the longitudinal direction. The amount of movement of the drive wire in the longitudinal direction can be relatively easily controlled by using for example a step motor as the drive motor. Further, unlike in the related art, since the tray is not made to stop by making it strike a stopper member, the load acting on the tray is small, the durability of the tray is improved, and there is less trouble. Further, since it is possible to make the tray horizontal carrier stop at the accurate position by controlling the amount of movement of the drive wire in the longitudinal direction, there is no need to provide a stopper member, sensor, etc. for every stopping position of the tray, the configuration is simple and there is less trouble in this respect as well.

The first electronic device tray transporting apparatus according to the present invention and the second electronic device tray transporting apparatus according to the present invention are particularly suitable for use in the chamber section of an electronic device testing apparatus. In the chamber section of an electronic device testing apparatus, it is necessary to convey the tray in a vertical direction and necessary to convey it in a horizontal direction and an improvement of the operating speed of the tray carrier, a reduction of the rate of trouble, an improvement of the durability, and accurate control of the stopping position are sought.

To achieve the fourth object of the present invention, according to the present invention, there is provided an in-chamber member movement mechanism comprising a drive wire for driving a movement member arranged movably in a chamber section with an inside set to conditions different from the external environment; a drive source arranged outside the chamber section and linked with the drive wire so as to make the drive wire move along the longitudinal direction; a drive wire introduction member attached to the chamber wall and forming a through hole through which the drive wire may pass between the inside and outside of the chamber section; and a moisture absorbing member attached to the through hole of the drive wire introduction member and sliding over the outer periphery of the drive wire.

At the chamber inner side of the through hole of the drive wire introduction member is preferably provided a blow hole for blowing out dry air.

The moisture absorbing member is constituted by a felt ring and is attached at the chamber outer side of the through hole.

The two ends of the through hole in the axial direction are preferably provided with seal members substantially airtightly sealing the inside of the through hole.

The movement member preferably is a carrier for conveying a tray holding devices under test inside the chamber section.

With the in-chamber member movement mechanism according to the present invention, since a drive wire is used to make the in-chamber movement member move, it is possible to control the amount of movement of the drive wire in the longitudinal direction to make the in-chamber movement member (for example, tray horizontal carrier) stop at an accurate position. The amount of movement of the drive wire in the longitudinal direction can be relatively easily controlled by using for example a step motor as the drive source. Further, unlike in the related art, since the tray or other movement member is not made to stop by making it strike a stopper member, the load acting on the movement member is small, the durability of the movement member is improved, and there is less trouble. Further, since it is possible to make the tray horizontal carrier or other movement member stop at the accurate position by controlling the amount of movement of the drive wire in the longitudinal direction, there is no need to provide a stopper member, sensor, etc. for every stopping position of the tray, the configuration is simple, and there is less trouble in this respect as well.

In particular, in the present invention, the through hole of the drive wire introduction member attached to the chamber wall has attached to it a felt ring or other moisture absorbing member. This moisture absorbing member slides over the outer periphery of the drive wire, so seals the through hole and prevents the entry of outside air to improve the insulation and wipes off condensation from the drive wire. Further, by providing a blow hole for blowing dry air at the chamber inner side of the through hole, the dry air blown from the blow hole fills the inside of the through hole and therefore effectively prevents the outside air from entering inside the through hole. As a result, the insulation is improved and condensation is controlled. Further, the dry air blown out from the blow hole also functions to dry away the moisture absorbed by the moisture absorbing member.

The electronic device testing apparatus according to the present invention is provided with an electronic device tray having a tray body provided with a holder in which an electronic device under test is held and a shutter which is attached movably with respect to the tray body and opens and closes an opening of the holder; an operating mechanism for making the shutter move with respect to the holder to open or close the opening; a tray movement mechanism for making the electronic device tray move; an electronic device transfer mechanism for taking out and inserting an electronic device held in the holder in a state where the operating mechanism is used to make the shutter move and open the opening; and a chamber section having positioned inside it a measurement unit for testing the electronic device taken out by the electronic device transfer mechanism.

The operating mechanism preferably has a drive mechanism which makes the shutter move with respect to the tray body in the state where the electronic device tray is stationary. As the drive mechanism, for example a fluid pressure cylinder or electric motor or the like may be mentioned. Further, in accordance with need, a link mechanism or other various operation conversion mechanisms may be used as part of the drive mechanism.

Further, the operating mechanism may be a stopper which catches on the engagement portion of the shutter and makes the shutter move relative to the tray body when the electronic device tray is made to move by the tray movement mechanism.

In this case, the shutter may be opened or closed utilizing the movement of the electronic device tray. For example, it is possible to provide an affixed stopper abutting against only the shutter at the tester side when the electronic device tray is conveyed to the reloading position of the electronic device under test and using the relative movement of the tray body and stopper to open or close the shutter.

The electronic device testing apparatus according to a further aspect of the present invention is provided with a chamber section in which a measurement unit for testing an electronic device is positioned; a tray carrier arranged movably in the chamber section; a drive wire for driving the tray carrier; an electronic device tray arranged detachably with respect to the tray carrier; and an electronic device transfer mechanism for picking and placing an electronic device in the electronic device tray.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become more apparent from the following description of the preferred embodiments given with reference to the attached drawings, which are given by way of illustration only, and thus are not limitative of the present invention, and in which.

DESCRIPTION OF THE PREFERRED EMBODIMENTS

Preferred embodiments of the present invention will be discussed in detail below:

First Embodiment

First, an explanation will be given of the overall configuration of an IC tester (IC testing apparatus) according to an embodiment of the present invention based mainly on FIG. 1 to FIG. 6.

Figure 1:
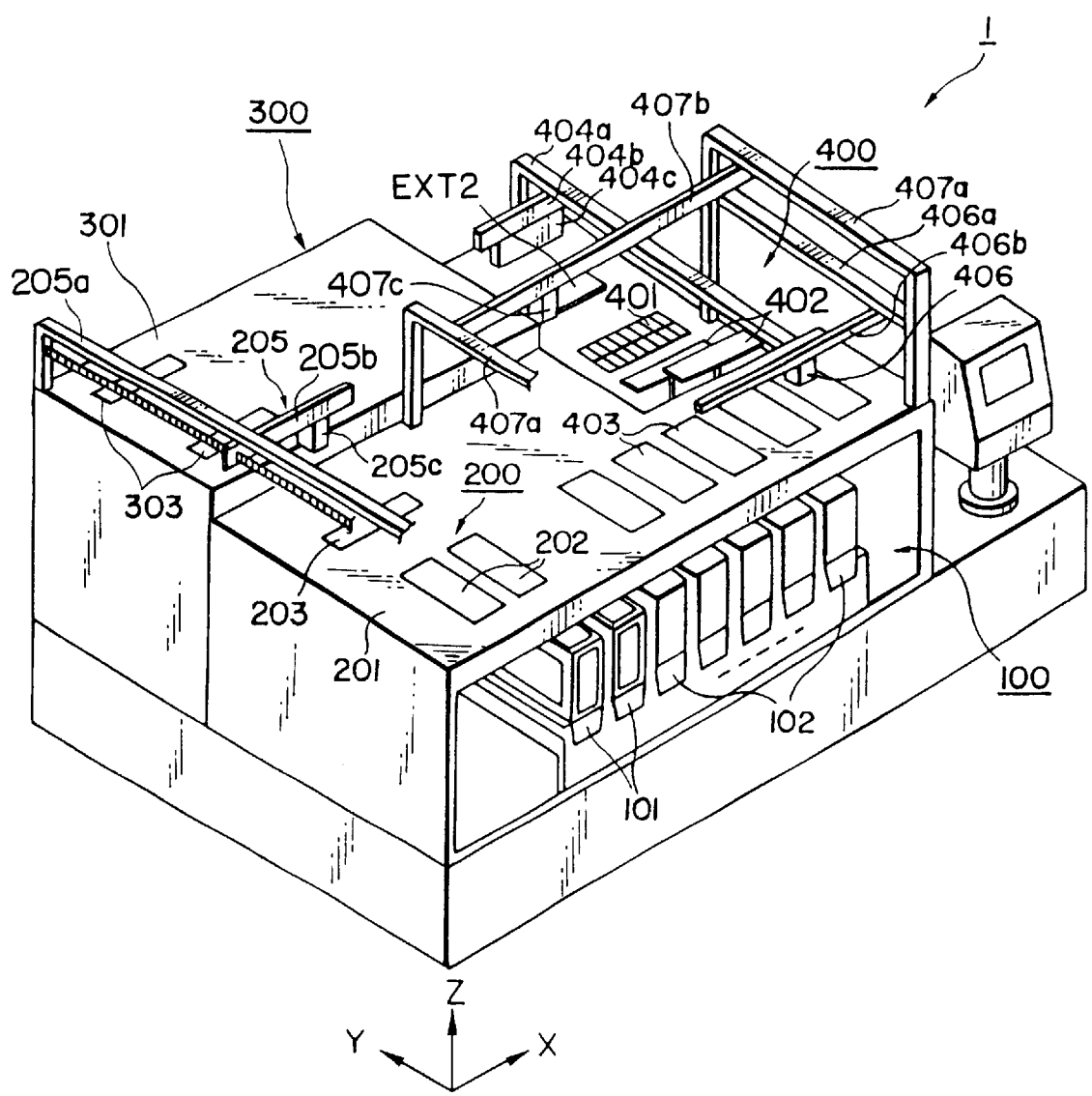
FIG. 1 is a partially cutaway perspective view of an IC tester according to a first embodiment of the present invention.
Figure 2:
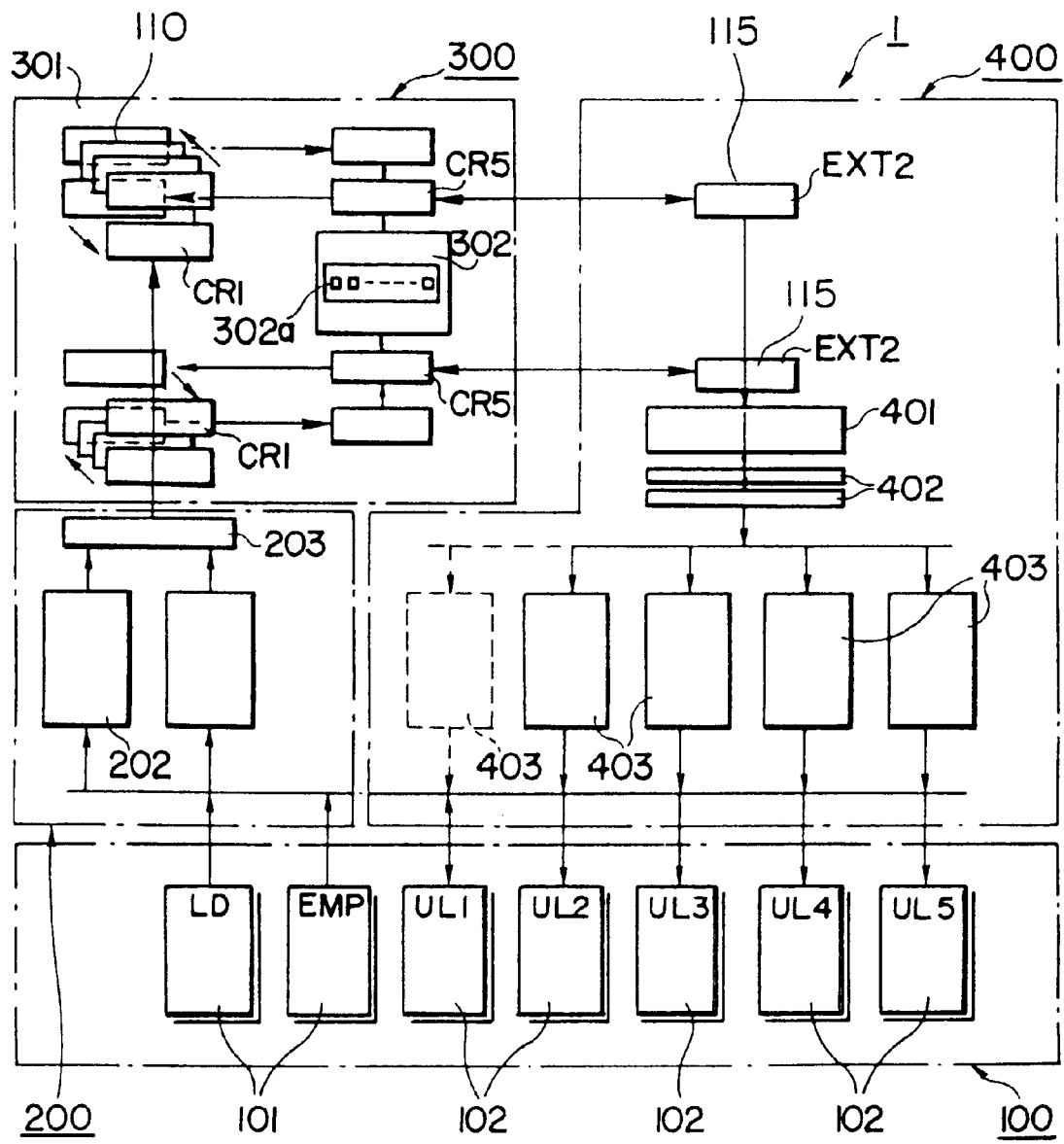
FIG. 2 is a conceptual view of the method of handling an IC chip in the IC tester.
Figure 3:
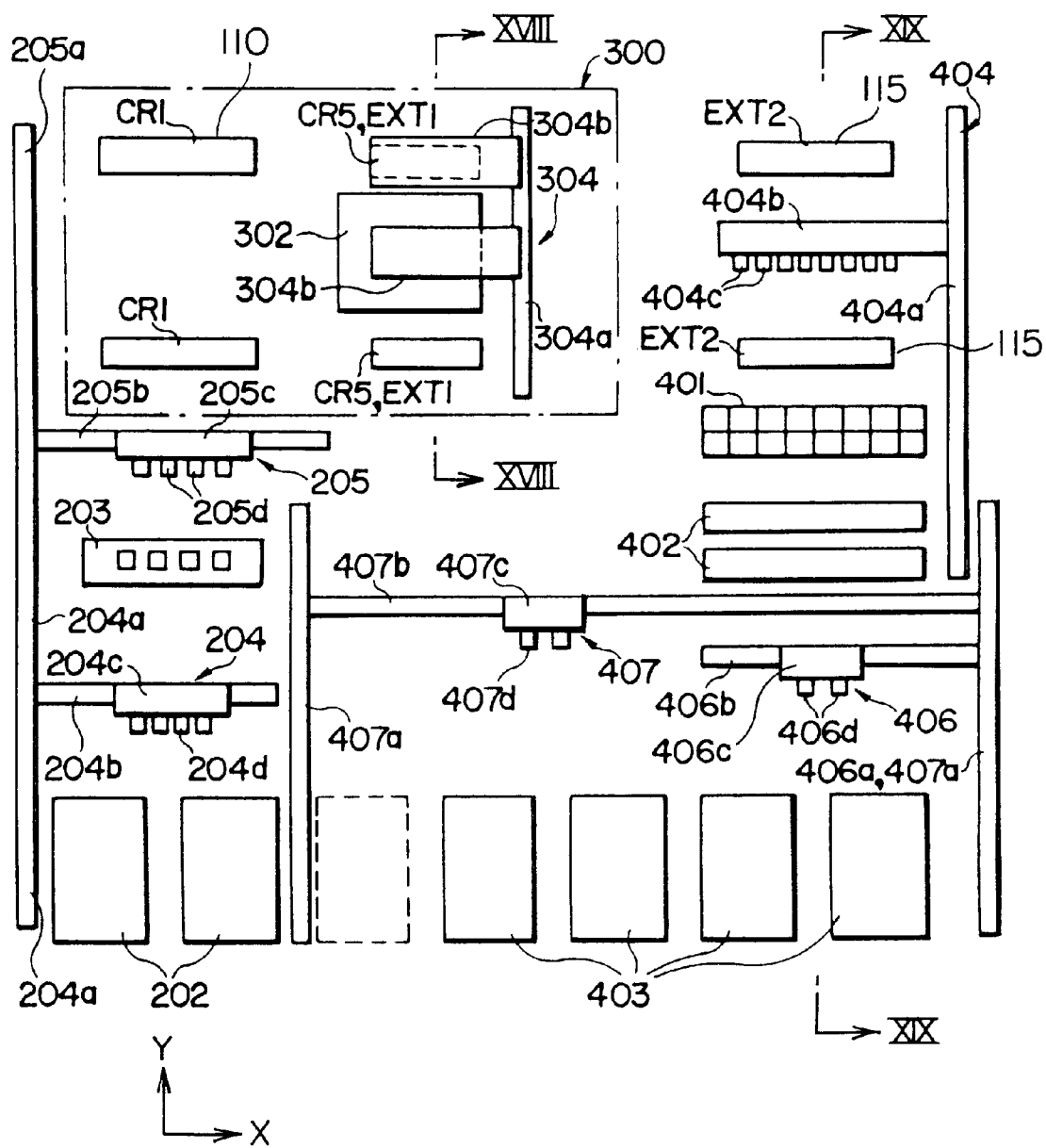
FIG. 3 is a plan view schematically showing various transfer means provided in the IC tester.

Note that FIG. 2 and FIG. 3 are views for explaining the method of handling of an IC chip and the range of operation of the transfer means in the IC tester and shows in a planar manner the members actually arranged in the vertical direction. Therefore, the mechanical (three-dimensional) structure will be explained with reference to FIG. 1.

The IC tester 1 of the present embodiment tests (inspects) whether the IC is operating suitably in a state with a high temperature or low temperature thermal stress applied to the IC chip and sorts the IC chips in accordance with the test results. The operating test in the state with thermal stress applied is performed by reloading the IC chips from a tray carrying a large number of ICs under test (see FIG. 5) to an IC test tray 110 (see FIG. 7 and FIG. 8) conveyed through the inside of the IC tester 1. The IC test tray 110 corresponds to the electronic device tray of the present invention.

The IC tester 1 of the present embodiment, as shown in FIG. 1 and FIG. 2, is comprised of an IC magazine 100 which holds the IC chips under test or sorts and stores the tested IC chips, a loader section 200 which sends the IC chips sent from the IC magazine 100 into a chamber section 300, a chamber section 300 including a test head, and an unloader section 400 sorting and taking out post-test ICs tested in the chamber section 300.

(IC Magazine 100)

The IC magazine 100 is provided with pre-test IC stockers 101 for holding pre-test IC chips and post-test IC stockers 102 for holding IC chips sorted in accordance with the test results.

Figure 4:
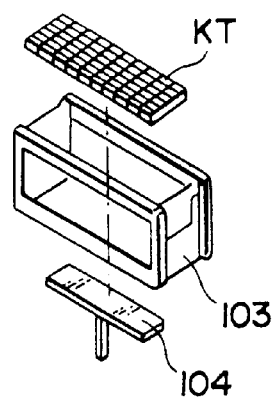
FIG. 4 is a perspective view of the structure of an IC stocker of the IC tester.
Figure 5:
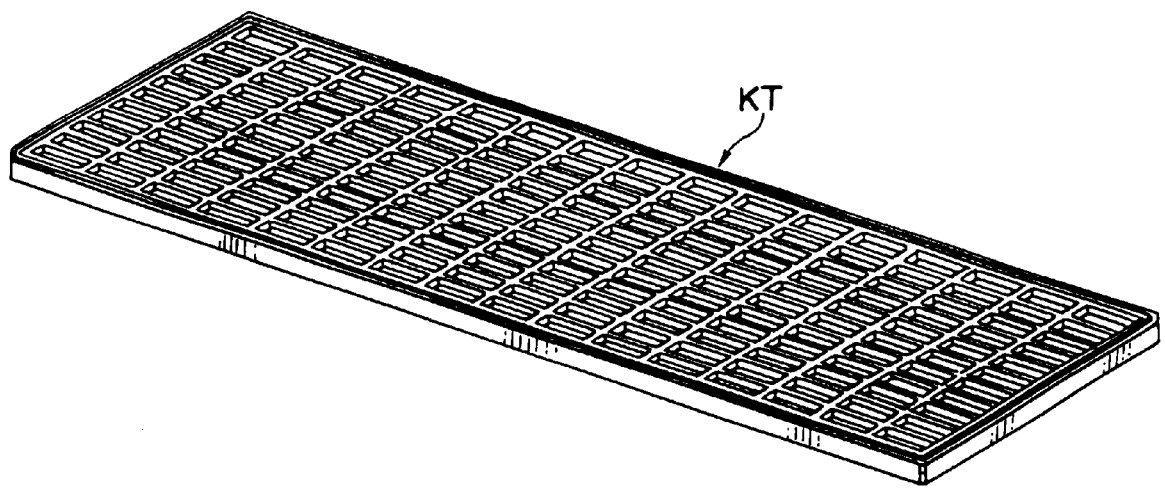
FIG. 5 is a perspective view of a customer tray used in the IC tester.

These pre-test IC stockers 101 and post-test IC stockers 102, as shown in FIG. 4, are each comprised of a frame-shaped tray support frame 103 and an elevator 104 able to enter from under the tray support frame 103 and move toward the top. The tray support frame 103 supports in it a plurality of stacked customer trays KT as shown in the enlarged view of FIG. 5. Only the stacked customer trays KT are moved up and down by the elevator 104.

A pre-test IC stocker 101 holds stacked customer trays KT on which the IC chips under test are held, while a post-test IC stocker 102 holds stacked customer trays KT on which IC chips finished being tested are suitably sorted.

Note that since the pre-test IC stockers 101 and the post-test IC stockers 102 are structured the same, the numbers of the pre-test IC stockers 101 and the post-test IC stockers 102 may be suitably set in accordance with need.

In the example shown in FIG. 1 and FIG. 2, the pre-test stockers 101 include one regular stocker LD and one empty stocker EMP provided next to that to be sent to the unloader section 400, while the post-test IC stockers 102 include five stockers UL-1, UL-2,..., UL-5 and can hold IC chips sorted into a maximum of five classes according to the test results. That is, in addition to classifying IC chips as good and defective, it is possible to divide the good IC chips into ones with high operating speeds, ones with medium speeds, and ones with low speeds or the defective IC chips into ones requiring retesting etc.

(Loader Section 200)

A customer tray KT is conveyed from the lower side of the test board 201 to a window 202 of the loader section 200 by a tray transfer arm (not shown) provided between the IC magazine 100 and test board 201. Further, in the loader section 200, the IC chips loaded on the customer tray KT are transferred once to a pitch conversion stage 203 by a first transfer mechanism 204. There, the mutual positions of the IC chips are corrected and the pitches converted, then the IC chips transferred to the pitch conversion stage 203 are reloaded on an IC test tray 110 stopped at a position CR1 (see FIG. 6) in the chamber section 300 using a second transfer mechanism 205.

The pitch conversion stage 203 provided on the test board 201 between the window 202 and the chamber section 300 is an IC position correcting and pitch converting means having relatively deep indentations with peripheral edges surrounded with inclined surfaces. When an IC chip picked up by the first transfer mechanism 204 is dropped into the indentation, the dropping position of the IC chip is corrected by the inclined surfaces. Due to this, the mutual positions of for example four IC chips are accurately determined. Further, even if the pitch by which chips are carried differs between a customer tray KT and an IC test tray 110, by picking up the IC chips corrected in position and converted in pitch by the stage 203 by the second transfer mechanism and reloading them on the IC test tray 110, it is possible to reload the IC chips with a good positioning accuracy in the IC holders 14 formed in the IC test tray 110.

The first transfer mechanism 204 reloading the IC chips from the customer tray KT to the pitch conversion stage 203, as shown in FIG. 3, is provided with a rail 204a laid over the top of the test board 201, a movable arm 204b able to move back and forth (this direction designated as the Y-direction) between the customer tray KT and the pitch conversion stage 203 by this rail 204a, and a movable head 204c supported by the movable arm 204b and able to move in the X-direction along the movable arm 204b.

The movable head 204c of the first transfer mechanism 204 has suction heads 204d attached facing downward. The suction heads 204d move while drawing out air to pick up IC chips from a customer tray KT and drop the IC chips on the pitch conversion stage 203. For example, about four suction heads 204d are provided on the movable head 204c, so it is possible to drop four IC chips at one time on the pitch conversion stage 203.

On the other hand, the second transfer mechanism 205 reloading the IC chips from the pitch conversion stage 203 to an IC test tray 110 in the chamber section 300 is similarly configured. As shown in FIG. 1 and FIG. 3, it is provided with a rail 205a laid over the top of the test board 201 and chamber body 301, a movable arm 205b able to move back and forth between the pitch conversion stage 203 and a position CR1 inside the chamber, and a movable head 205c supported by the movable arm 205b and able to move in the X-direction along the movable arm 205b.

The movable head 205c of the second transfer mechanism 205 has suction heads 205d attached facing downward. The suction heads 205d move while drawing out air to pick up IC chips from the pitch conversion stage 203 and reload the IC chips on an IC test tray 110 at the position CR1 through an inlet 303 formed in the ceiling of a chamber body 301. For example, about four suction heads 205d are provided on the movable head 205c, so it is possible to reload four IC chips at one time on the IC test tray at the position CR1.

(Chamber Section 300)

The chamber section 300 functions as a constant temperature section for giving a desired high temperature or low temperature thermal stress to IC chips loaded on an IC test tray 110. The IC chips given the thermal stress are made to contact the contact sections 302a of the test head 302 in a constant temperature state.

Note that in the IC tester 1 of the present embodiment, the IC chips are treated by a later mentioned hot plate 401 when a low temperature thermal stress has been applied to the IC chips, but the heat is allowed to naturally dissipate when a high temperature thermal stress has been applied to the IC chips. When providing a separate soak chamber or soak zone to apply a high temperature, however, the IC chips are cooled by blowing air to return them to room temperature. Further, when applying a low temperature to the IC chips in the chamber section, the IC chips may be heated by hot air or a heater etc. to return them to a temperature of an extent not causing condensation.

The test head 302 having the contact sections 302a is preferably provided at the bottom side of the center of the chamber body 301 detachable with respect to the chamber body 301. This is to enable changes in the type of the IC chips under test to be quickly handled.

Stationary positions CR5 of IC test trays 110 are provided at the two sides of the test head 302. IC chips loaded on an IC test tray 110 conveyed to a position CR5 are directly carried to the test head 302 by a third transfer mechanism 304. The IC chips are brought into electrical contact with the contact sections 302a to test the IC chips.

The IC chips finished being tested are not returned to the IC test trays 110, but are reloaded on eject trays 115 moving into and out of positions EXT1directly above the positions CR5 at the two sides of the test head 102 and conveyed outside of the chamber section 300. When a high temperature thermal stress had been applied, the IC chipss are allowed to naturally cool after being conveyed outside of the chamber section 300.

Figure 6:
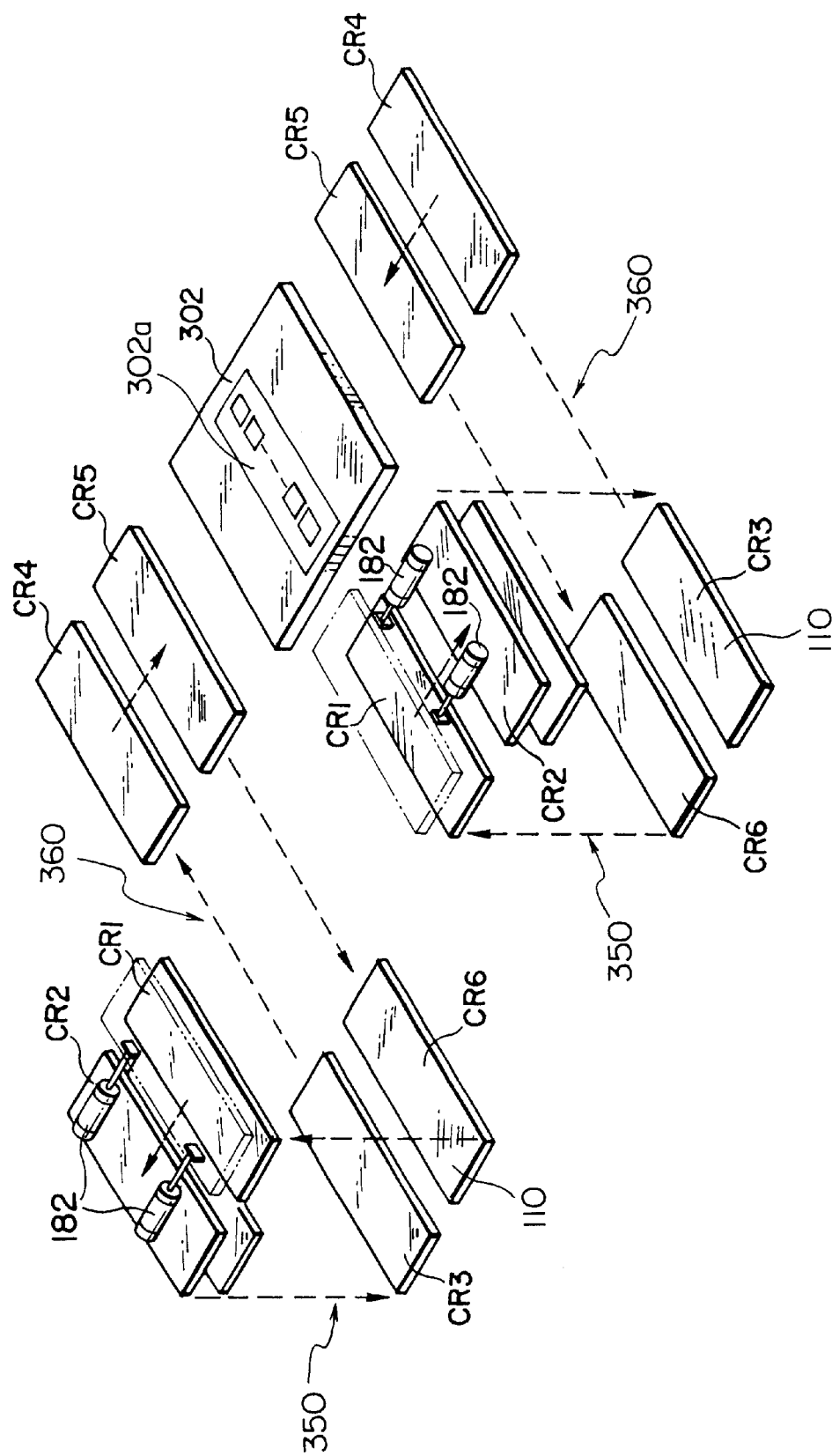
FIG. 6 is a perspective view for explaining a path of conveyance of the electronic device tray.

Next, a detailed explanation will be given of an IC test tray 110 according to the present embodiment (electronic device tray). An IC test tray 110 of the present embodiment is conveyed circulated inside the chamber section 300. The state of handling is shown in FIG. 6. As shown in FIG. 2, FIG. 3, and FIG. 6, in the present embodiment, there are two positions CR1 where the IC chips sent from the loader section 200 are loaded at the ceiling of the chamber section 300. IC chips from the loader section 200 are loaded on two IC test trays 110 at these positions CR1. The IC test trays 110 at these positions CR1 are conveyed to positions CR2 in the horizontal direction by a horizontal carrier, not shown in FIG. 6.

Note that the positioning where the IC chips are received from the second transfer mechanism 205 are strictly speaking slightly above the positions CR1 shown in the figure. These positions are shown by the two-dot chain lines in FIG. 6. The IC test trays 110 are made to approach the inlets 303 formed in the ceiling of the chamber body 301 (see FIG. 1) from below and the inlets 303 are blocked by the IC test trays 110 to prevent heat in the chamber section 300 from being exhausted. Therefore, the IC test trays 110 rise slightly from the positions CR1 when receiving the IC chips.

The IC test trays 110 conveyed to the positions CR2 are conveyed by vertical carriers 350 explained in detail in another embodiment downward in the vertical direction in a stacked state. The IC test trays 110 at the positions CR5 stand by until they are emptied, then are conveyed by horizontal carriers 360 (explained later in detail in another embodiment) from the lowermost level positions CR3 to positions CR4 of substantially the same level as the test head 302. A high temperature or low temperature thermal stress is given to the IC chips mainly during their conveyance.

The IC test trays 110 are further conveyed by horizontal carriers, not shown in FIG. 6, from the positions CR4 in the horizontal direction toward the test head 302 side to the positions CR5. There, only the IC chips are sent to the contact sections 302a of the test head 302. The IC test trays 110 whose IC chips have been sent to the contact sections 302a are conveyed to the positions CR6 in the horizontal direction from the positions CR5 and then conveyed upward in the vertical direction to return to their original positions CR1.

Since the IC test trays 110 are conveyed circulated only inside the chamber section 300 in this way, once raised in temperature or lowered in temperature, the temperature of the IC test trays themselves are maintained and as a result the heat efficiency at the chamber section 300 is improved.

Figure 7:
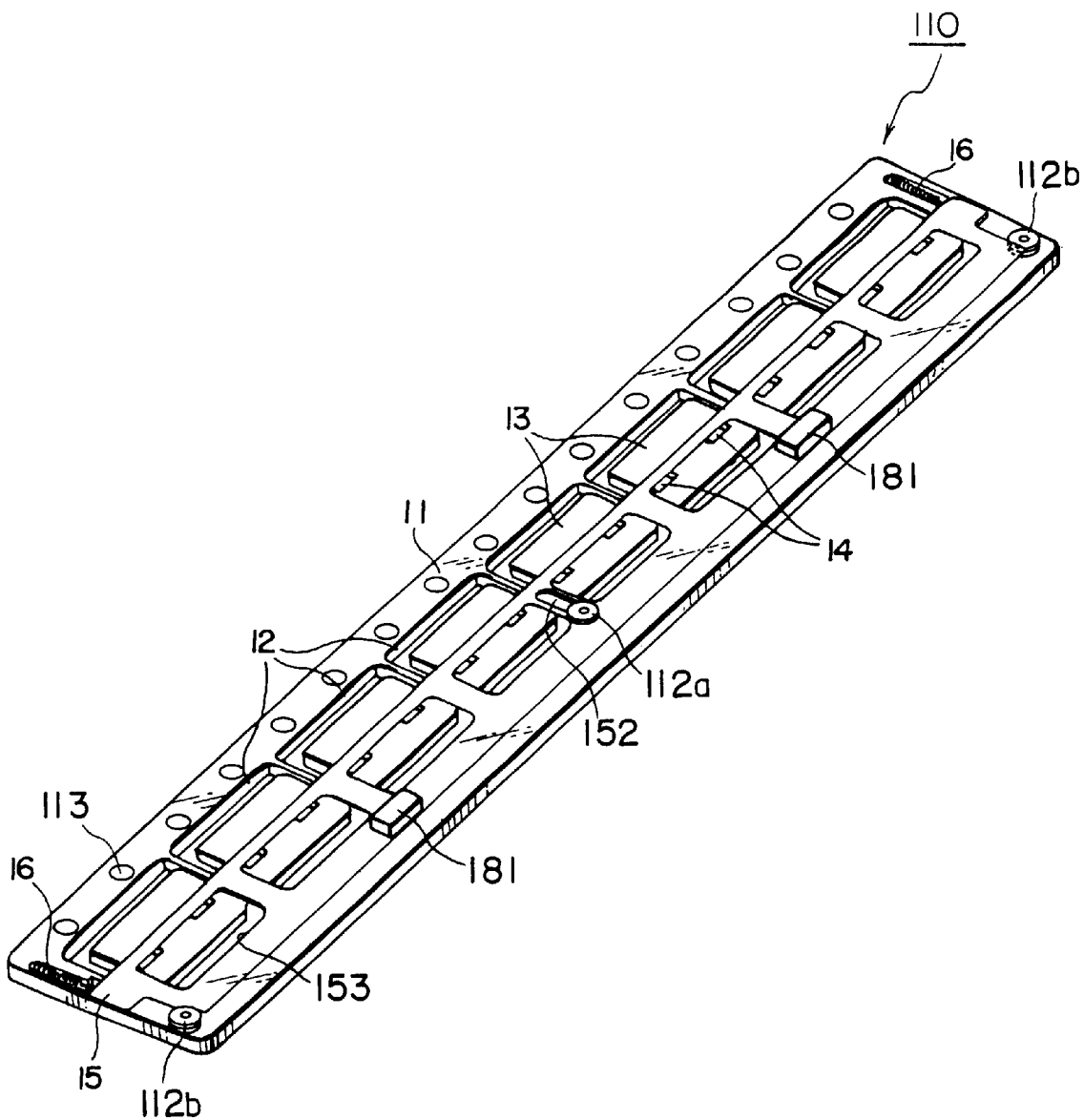
FIG. 7 is a perspective view of an electronic device tray according to a first embodiment of the present invention.
Figures 8A, 8B:
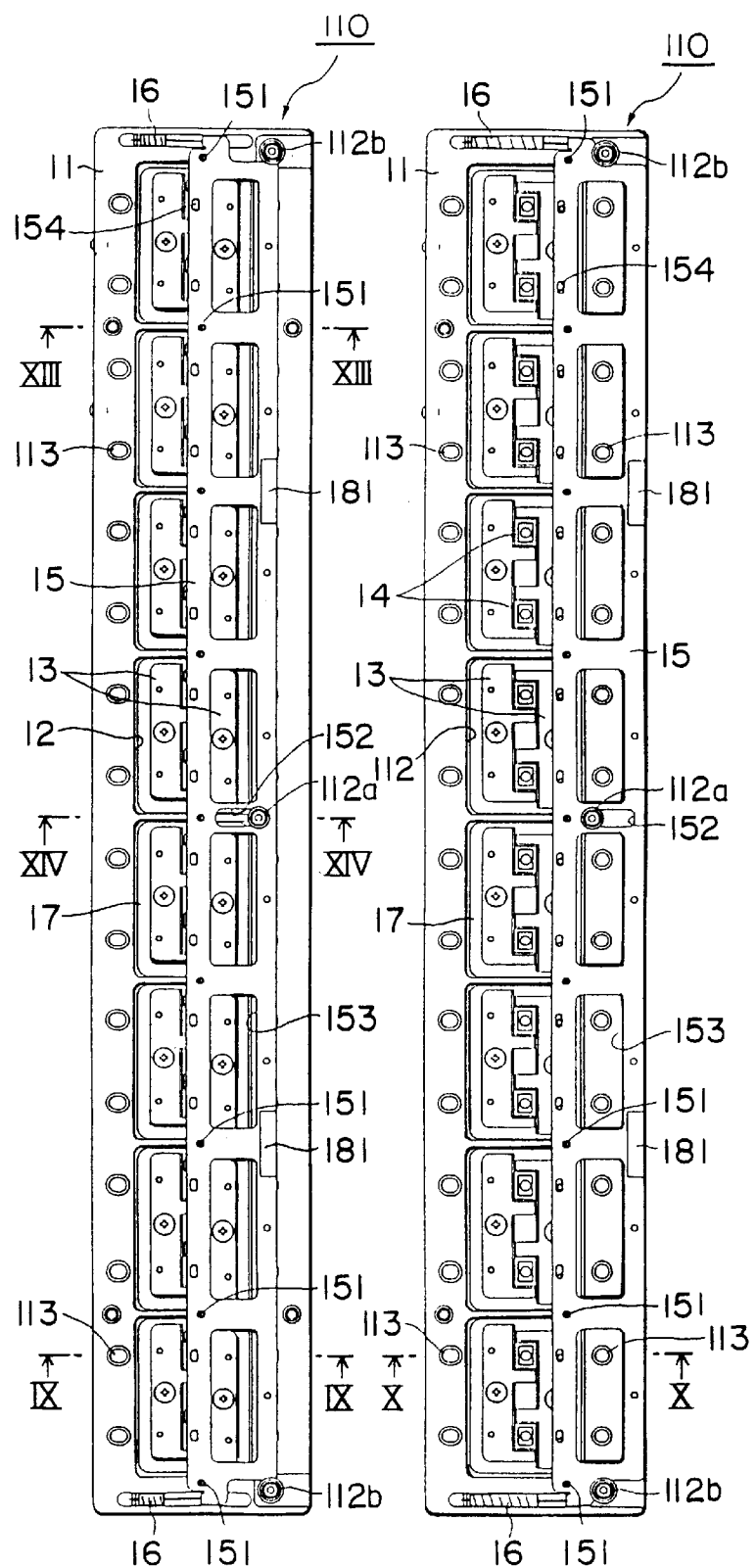
FIG. 8A is a plan view of an electronic device tray in a state with the shutter closed and FIG. 8B is a plan view of an electronic device tray in a state with the shutter open.

FIG. 7, FIG. 8A, and FIG. 8B are a perspective view and plan views of the structure of an IC test tray 110 of the present embodiment. Eight indentations 12 are formed in the top surface of an elongated plate-shaped tray body 11. Two IC holders 1 for carrying IC chips are formed in each of these indentations 12.

Figure 15A:
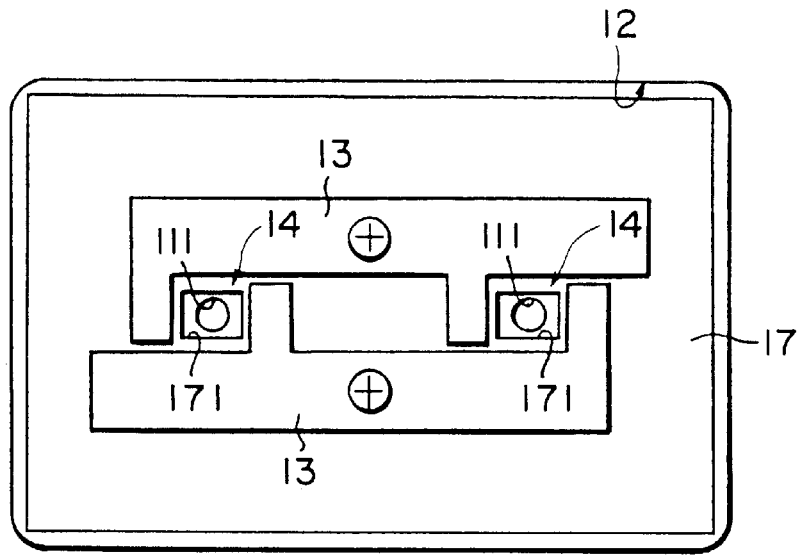
FIG. 15A and FIG. 15B are plan views of an IC holder of the electronic device tray shown in FIG. 7.
Figure 15B:
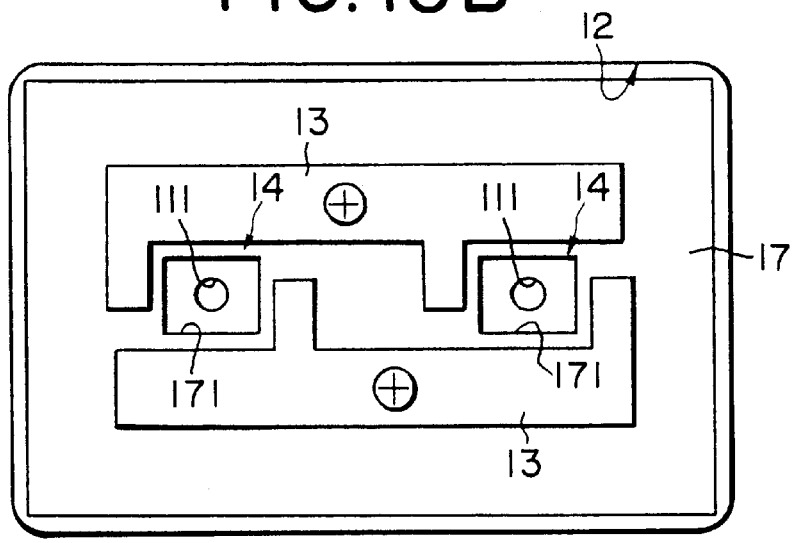

Each of the IC holders 14 of the present embodiment, as shown in FIGS. 15A and 15B, is comprised of two blocks 13, 13 of the same shape facing each other and screwed to an indentation 12 of the tray body 11 in that state. Here, as shown in FIG. 7, 16 IC holders 14 for carrying IC chips are formed along the longitudinal direction of the tray body 11. The pitch P1 by which the IC chips are carried in the longitudinal direction of the tray body 11 (see FIG. 17) is set to equal intervals.

As shown in FIGS. 15A and 15B, the positions where the blocks 13, 13 are attached to an indentation 12 of the tray body 11 are suitably determined in accordance with the size and shape of the IC chips to be carried. For example, when carrying IC chips larger than the IC chips carried in the IC holders 14 shown in FIG. 15A, as shown in FIG. 15B, the same blocks 13, 13 may be used and only their positions of attachment changed. At this time, since the screwing positions are changed, the tray body 11 may be made one designed exclusively for one type of IC chip or may be given an elongated screwing portion to make the tray body 11 usable for different types of IC chips. By suitably combining this type of block 13, it is possible to handle IC chips of all sorts of sizes.

Figure 15C:
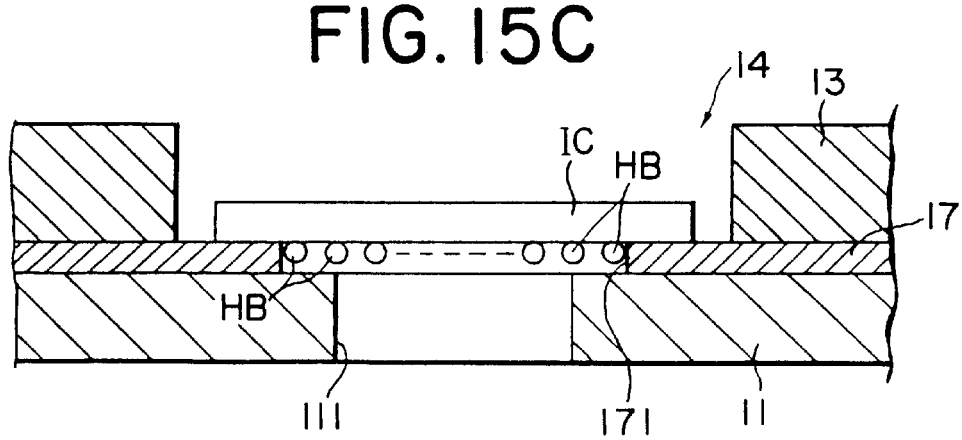
FIG. 15C is a sectional view of the IC holder.

As shown in FIGS. 15A to 15C, an IC holder 14 of the present embodiment grips a guide plate 17 formed with guide holes (guide means) 171 between the indentation 12 of the tray body 11 and the blocks 13, 13. The state where one IC holder 14 holds an IC chip is shown in FIG. 15C, but when positioning accuracy cannot be secured by the outer periphery of the package mold such as in the case where the IC chip is a chip size package BGA type IC chip etc., the solder balls HB of the IC chip are positioned by the peripheral edges of the guide holes 171 of the guide plate 17 so as to improve the accuracy of contact with the contact pins.

As shown in FIG. 7, FIG. 8A, and FIG. 8B, an IC test tray 110 is provided with a shutter 15 for opening and closing openings so as to prevent IC chips held in the IC holders 14 of the IC test tray 110 from deviating in position or jumping out.

The shutter 15 of the present embodiment, as shown in FIG. 7, FIG. 8A, FIG. 8B, and FIG. 14, is attached to the tray body 11 so as to be able to slide freely in a direction substantially perpendicular to it longitudinal direction. To enable the shutter 15 to freely slide with respect to the tray body 11, a center roller 112a (center guide member) provided at a center position of the top surface of the tray body 11 in the longitudinal direction engages with an elongated hole 152 formed in the shutter 15. Further, a pair of side rollers 112b (side guide members) provided at the two end positions on the top surface of the tray body 11 are engaged with the two ends of the shutter 15 in the longitudinal direction to guide the sliding movement of the shutter.

In the present embodiment, the clearance between the center roller 112a and the elongated hole 152 of the shutter 15 is smaller than the clearance between the side rollers 112b and the two ends of the shutter 15. That is, the engagement between the center roller 112a and the elongated hole 152 of the shutter 15 is made an extent where there is almost no rattling with respect to the longitudinal direction of the tray body 11. As opposed to this, a slight space is provided between the two end rollers 112b and the two ends of the shutter 15. By doing this, even if thermal stress is applied to an IC test tray 110 in the chamber section 300, the expansion or contraction resulting from it is distributed to the two ends from the center roller 112 and suitably absorbed by the spaces provided at the two ends. Accordingly, the amount of expansion or contraction of the shutter 15 in the longitudinal direction becomes half the amount even at the two ends where expansion or contraction is the greatest and therefore it is possible to reduce the difference of the tray body 11 between expansion and contraction.

At the two ends of the shutter 15 are affixed ends of a pair of springs 16 serving as elastic members. The other ends of the springs 16 are affixed to the tray body 11. The shutter 15 therefore receives a spring force in a direction closing the openings of the holders 14 at all times. To make the shutter 15 slide with respect to the tray body 11 and open the openings of the IC holders 14 (see FIG. 8B), a later explained shutter operating mechanism (fluid pressure cylinder 182 in FIG. 9 and FIG. 10 or stopper 183 in FIG. 11) is used. By opening the openings of the IC holders 14, it becomes possible to insert IC chips in the IC holders 14 or take them out from the IC holders 14.

On the other hand, when the shutter operating mechanism is released, the shutter 15 returns to its original position due to the elastic force of the springs 16 and, as shown in FIG. 8A, the openings of the IC holders 14 of the tray body 11 are covered by the shutter 15. Due to this, the IC chips held in the IC holders 14 are held kept from deviating in position or jumping out even during high speed conveyance.

Note that to make the shutter 15 slide with respect to the tray body 11 by the later explained shutter operating mechanism, operating blocks 181 (engagement portions) are affixed at two positions on the top surface of the shutter 15 in the longitudinal direction.

Further, in the IC test tray 110 of the present embodiment, to prevent interference between the shutter 15 and the top surface of the tray body 11 when operating the shutter 15 and enable the shutter 15 to be smoothly operated to open or close, a plurality of sliding members 151 (nine in the example of FIGS. 8A and 8B) are attached to the shutter 15.

The sliding members 151 are made of a material of a hardness lower than the metal constituting the tray body 11, for example, an engineering plastic or other plastic, and are attached in through holes formed in the shutter 15.

By providing these sliding members 151 between the shutter 15 and the tray body 11, the opening and closing operation of the shutter 15 becomes smooth and damage between the shutter 15 and tray body 11 can be prevented, so the lifetime of the IC test tray 110 itself can be extended.

Next, an explanation will be made of the shutter operating mechanism of the present embodiment.

First, there are two positions where the shutter 15 has to be opened in the handling path of an IC test tray 110 shown in FIG. 6: a position CR1 where IC chips are received from the second transfer mechanism 205 (strictly speaking slightly above the same) and a position CR5 where the IC chips are transferred to the contact sections 302a of the test head 302 by the third transfer mechanism 304.

Figure 9:
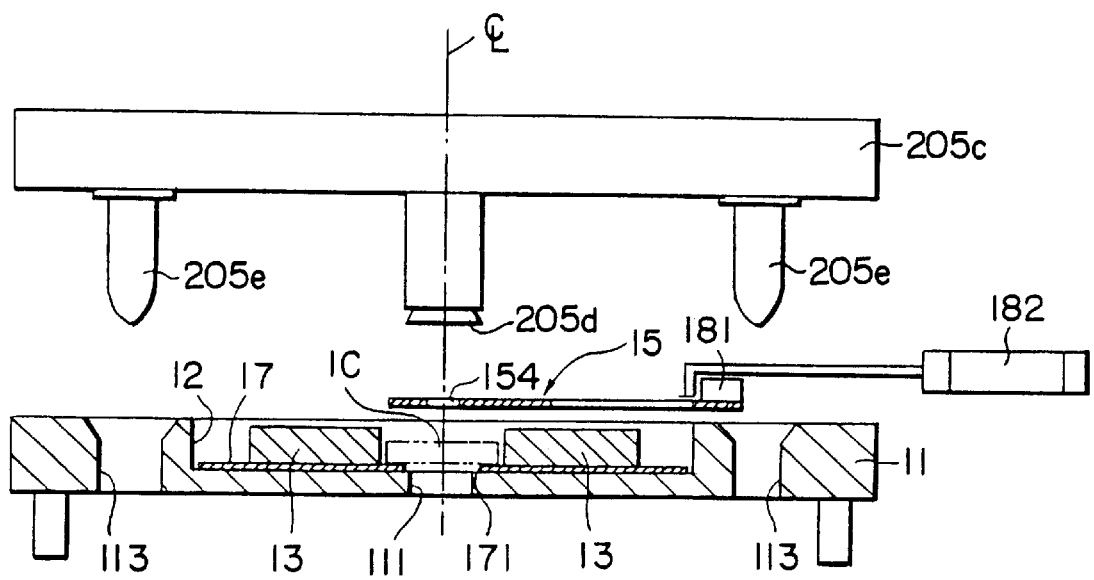
FIG. 9 is a sectional view along the line IX—XI in FIG. 8.
Figure 10:
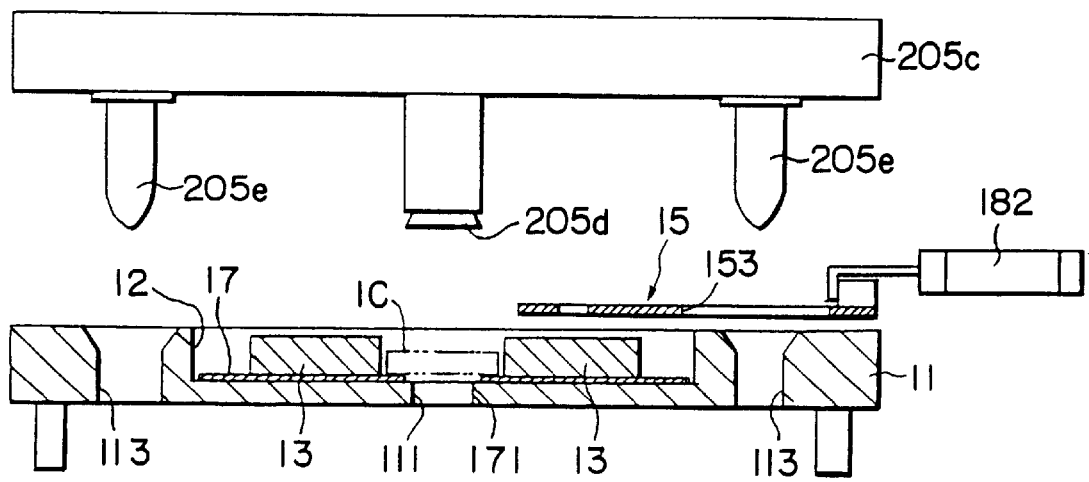
FIG. 10 is a sectional view along the line X—X in FIG. 8.

While not particularly limited to this, in the present embodiment, as shown in FIG. 6, FIG. 9, and FIG. 10, the operating blocks 181 provided at the top surface of the shutter 15 are caught by fluid pressure cylinders 182 to open and close the shutter. The fluid pressure cylinders 182 are attached to the chamber body 301 side. By making rods of the fluid pressure cylinders 182 retract from an IC test tray 110 in the stopped state, the operating blocks 181 provided at the shutter 15 are caught and the shutter 15 is opened. When the IC chips finish being loaded, the rods of the fluid pressure cylinders 182 are made to advance to allow the shutter 15 to close.

Figure 11:
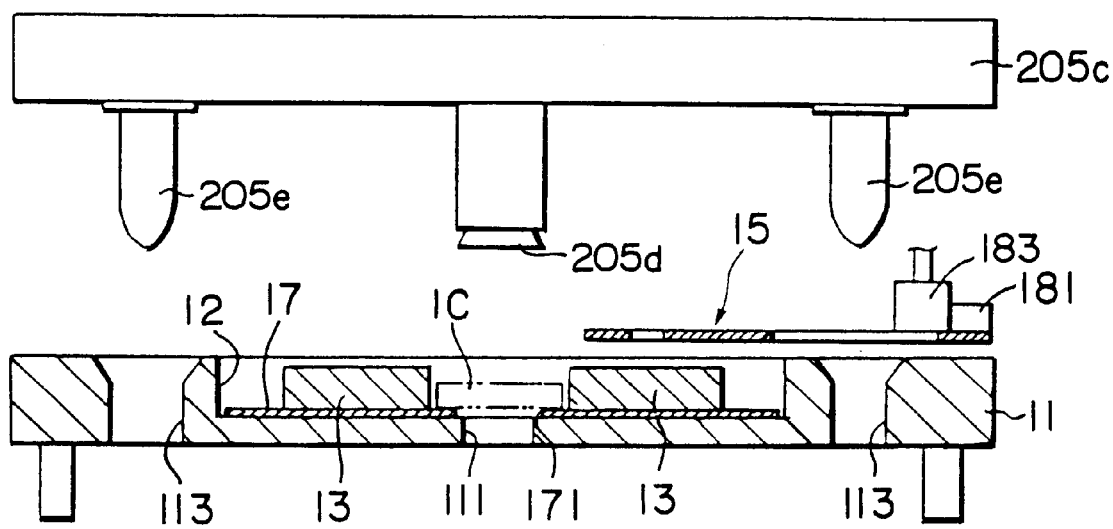
FIG. 11 is a sectional view of the state of the shutter opened by an opening/closing drive mechanism according to another embodiment of the present invention.
Figure 12:
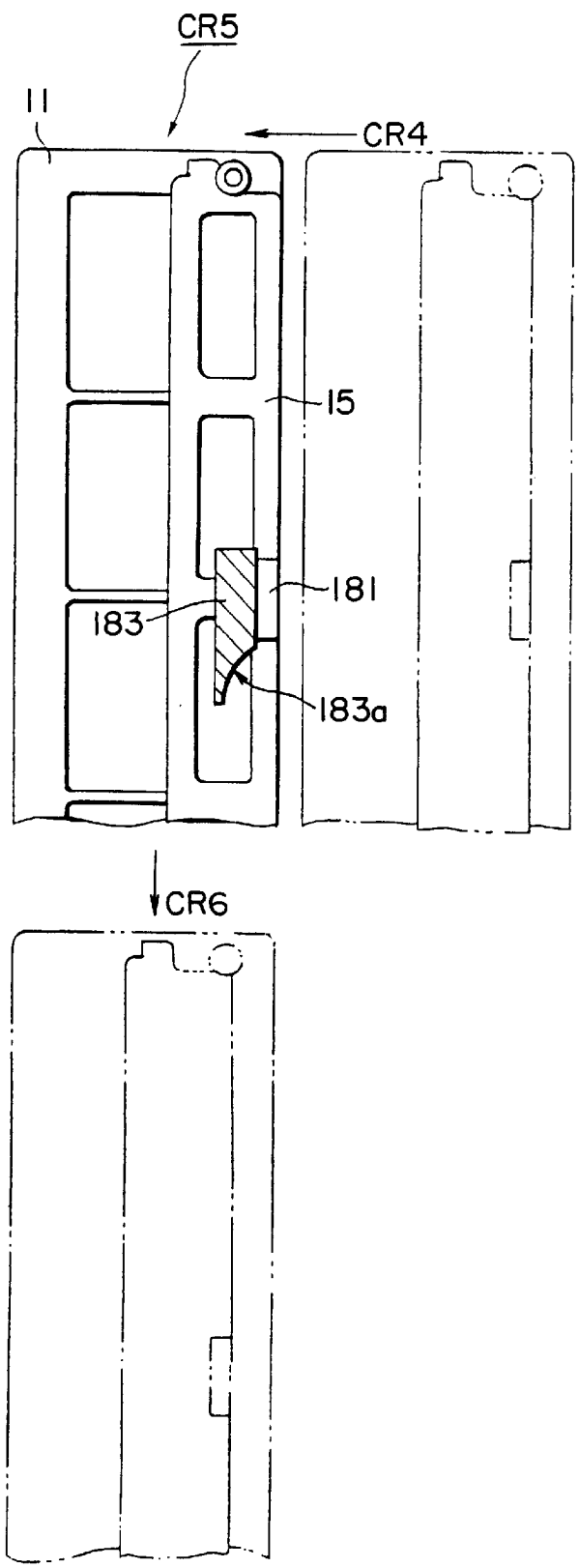
FIG. 12 is a plan view for explaining the operation of the opening/closing drive mechanism shown in FIG. 11.
Figure 13:
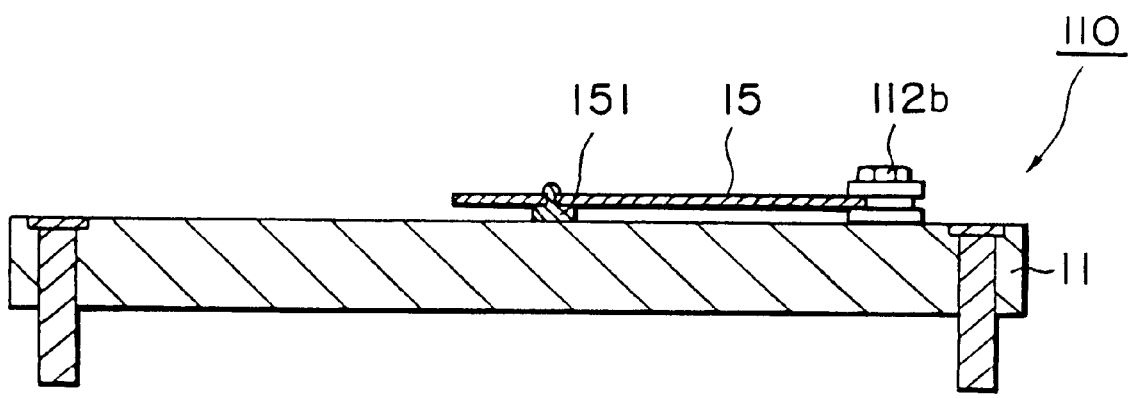
FIG. 13 is a sectional view along the line XIII—XIII of FIG. 8.
Figure 14:
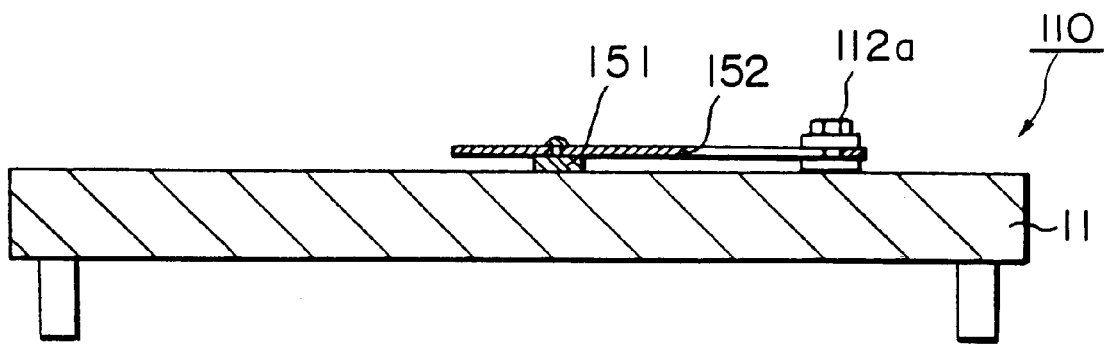
FIG. 14 is a sectional view along the line XIV—XIV of FIG. 8.

As opposed to this, since the IC test tray 110 itself is moved by a not shown horizontal carrier at a position CR5 near the test head 302, this action is utilized to open and close the shutter 15. That is, as shown in FIGS. 11 and 12, an IC test tray 110 is conveyed horizontally from a position CR4 to a position CR5. Stoppers 183 are provided to operate the shutter 15 midway. The stoppers 183 are provided fixed to the chamber body 301 side or to be able to move vertically. When an IC test tray 110 moves from a position CR4 to a position CR5, they strike the operating blocks 181 of the shutter 15 (see FIG. 11 and FIG. 12).

The stoppers 183 are provided at positions to make the shutter 15 fully open when the IC test tray 110 has stopped at a position CR5. In this example, two operating blocks 181 are provided at the shutter 15, so two stoppers 183 are also provided.

Further, the stoppers 183 are formed with cam faces 183a. This cam faces 183a are for gradually closing the shutter 15 fully opened at the position CR5 along with movement of the IC test tray 110. That is, as shown in FIG. 12, when an IC test tray 110 is conveyed from a position CR5 to a position CR6, the rear ends of the operating blocks 181 of the shutter 15 are in continuous contact with the cam faces 183a and therefore the shutter 15 is gradually closed.

In this way, the IC test tray 110 according to the present embodiment can hold and handle IC chips by just operating the shutter 15 without having a complicated shape or structure, so the work time is remarkably shortened.

Further, in the IC test tray 110 of the present embodiment, since the two ends of the shutter 15 are supported by the springs 16, 16, the balance of the shutter 15 when being operated becomes good and, as explained above, operation becomes easy by gripping just the center of the shutter 15.

The movable heads 205c, 304b of the second transfer mechanism 205 and the third transfer mechanism 304 are provided with positioning pins for positioning with an IC test tray 110 when transferring IC chips. The movable head 205c of the second transfer mechanism 205 is shown in FIG. 9 as a representative example, but the movable head 304b of the third transfer mechanism 304 is also similarly configured.

As shown in FIG. 9, the movable head 205c is provided with two positioning pins 205e, 205e straddling a single IC chip. Therefore, positioning holes 113, 113 with which the positioning pins 205e, 205e engage are formed at the tray body 11 side of the IC test tray 110. While not particularly limited to this, in the present embodiment, one positioning hole 113 (right side in FIG. 9) is made a circular hole, while the other positioning hole (left side in the figure) is made an elongated hole long in the width direction. Due to this, positioning is performed mainly by one positioning hole 113 while the positioning error with the positioning pin 205e is absorbed by the other positioning hole 113. Further, the top surfaces of the positioning holes 113 are tapered to draw in the positioning pins 205e.

Figure 16A:
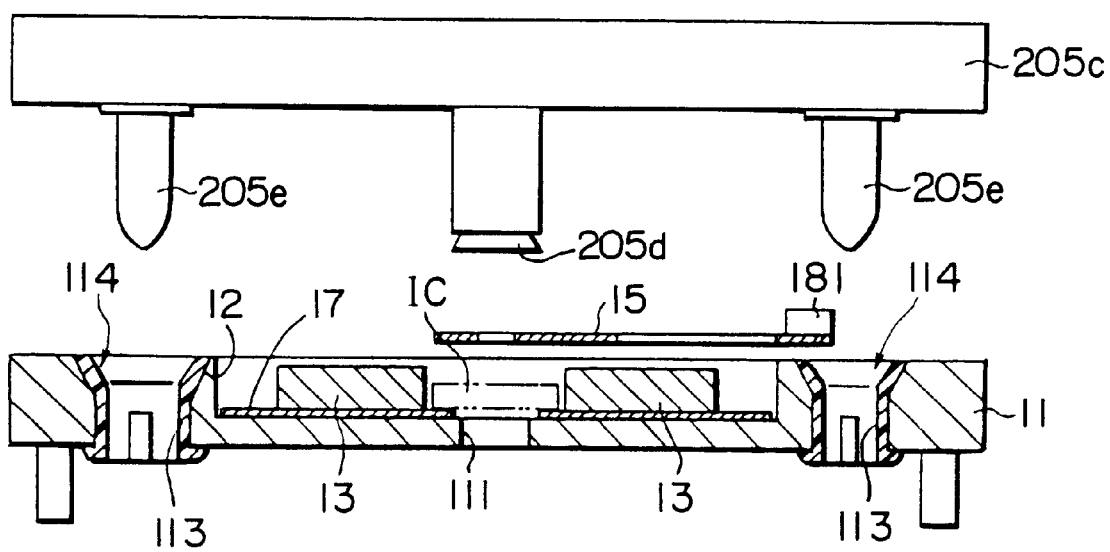
FIG. 16A is a sectional view of an electronic device tray according to another embodiment of the present invention.

In this case, the engagement of the positioning pins 205e and the positioning holes 113 is liable to cause wear of one of them and thereby a gradual reduction in the positioning accuracy. Therefore, for example, as shown in FIG. 16A, the positioning holes 113 of the tray body 11 may be fitted with bushes 114 (corresponding to the intermediary members of the present invention) comprised of a material of a hardness lower than the metal constituting the positioning pins 205e, for example, an engineering plastic or other plastic.

Figure 16B:
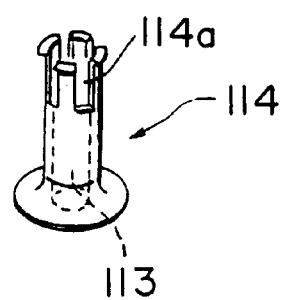
FIG. 16B is a perspective view of a bush shown in FIG. 16A.

The bushes 114, as shown in FIG. 16B, may be snapped into place in the holes of the tray body 11 due to the notches 114a formed at their front ends. Further, when desiring to detach the bushes 114, it is possible to easily remove them by using the elasticity of the notches 114a. By providing low hardness bushes 114 in the holes of the tray body 11, it is the bushes 114 that are worn when the positioning pins 205e engage with the holes. Therefore, when a bush 114 wears down to an extent where the positioning accuracy falls, it may be replaced and therefore the lifetime of the IC test tray 110 may be extended.

Further, as shown in FIG. 10, openings 153 are formed in the shutter 15 so that the positioning pins 205e can engage with the positioning holes 113 when the shutter 15 is opened.

Further, in the IC tester of the present embodiment, when all of the IC chips have been transferred to the test head 302 by the third transfer mechanism 304 at a position CR5 near the test head 302, the IC test tray 110 is returned from the position CR5 to a position CR6. At this time, a remainder detector is provided to confirm that no IC chips remain at any of the IC holders 14 of the IC test tray 110.

This remainder detector is comprised of a photoelectric sensor provided between the positions CR5 and CR6 shown in FIG. 6. It emits light in the Z-direction along the center line CL of the IC test tray 110 shown in FIG. 9 and receives the same. To enable the detection light to pass through, through holes 111 are provided at the bottom surfaces of the IC holders 14 of the tray body 11. Through holes 154 are provided at positions of the shutter 15 also corresponding to the IC holders 14. Due to this, when an IC test tray 110 finishes transferring IC chips and moves from the position CR5 to a position CR6, pulse signals of the movement are received from an encoder of the horizontal carrier. These are used to confirm the position timings of the IC holders 14 of the IC test tray 110 and confirm at the state of reception of light of the photoelectric sensor at those timings. Here too, if an IC chip remains in an IC holder 14, the photoelectric sensor will not detect light, so for example an alarm is issued to notify the operator of an abnormality.

Figure 17:
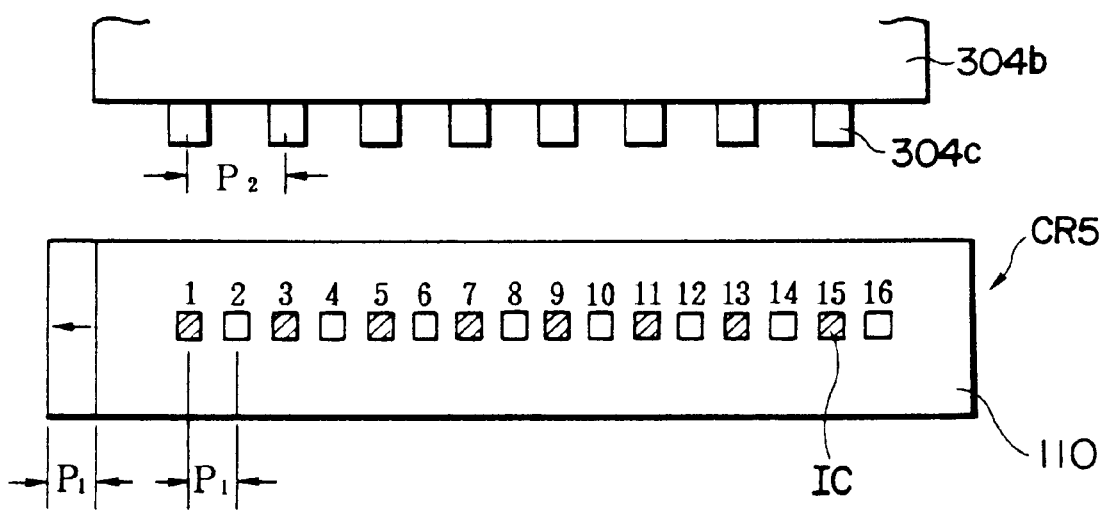
FIG. 17 is a plan view for explaining the test routine of an IC chip in a chamber section of the IC tester of FIG. 1.

The test head 302 of the present embodiment is provided with eight contact sections 302a at predetermined pitches P2. As shown in FIG. 17, suction heads 304c of the contact arm are provided at the same pitches P2. Further, the IC test tray 110 holds 16 IC chips at the pitch P1. At this time, the relationship P2=2·P1 stands.

The IC chips once connected to the test head 302 are arranged in one row and 16 columns as shown in the figure. Every other column of IC chips (portion shown by hatching in FIG. 17) is tested simultaneously.

That is, in the first test, the eight IC chips arranged in columns 1, 3, 5, 7, 9, 11, 13, and 15 are brought into contact with the contact sections 302a of the test head 302 for testing. In the second test, the IC test tray 110 is moved by exactly one column pitch P1 and the IC chips arranged in columns 2, 4, 6, 8, 10, 12, 14, and 16 are simultaneously tested. Therefore, IC test trays 110 conveyed to the positions CR5 at the two sides of the test head 302 move by exactly the pitch P1 in the longitudinal direction due to the not shown horizontal carrier.

The results of the test are stored at addresses determined by for example the identification number assigned to the IC test tray 110 and the numbers of the IC chips assigned inside the IC test trays 110.

Figure 18A:
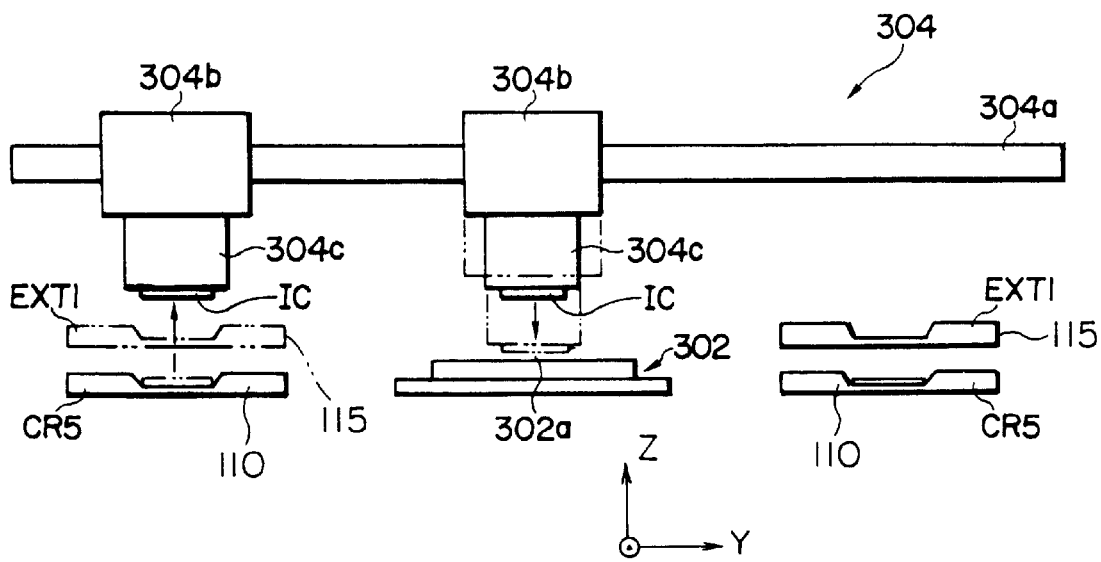
FIGS. 18A and 18B are schematic views for explaining the method of handling of an IC chip in a chamber section of an IC tester.
Figure 18B:
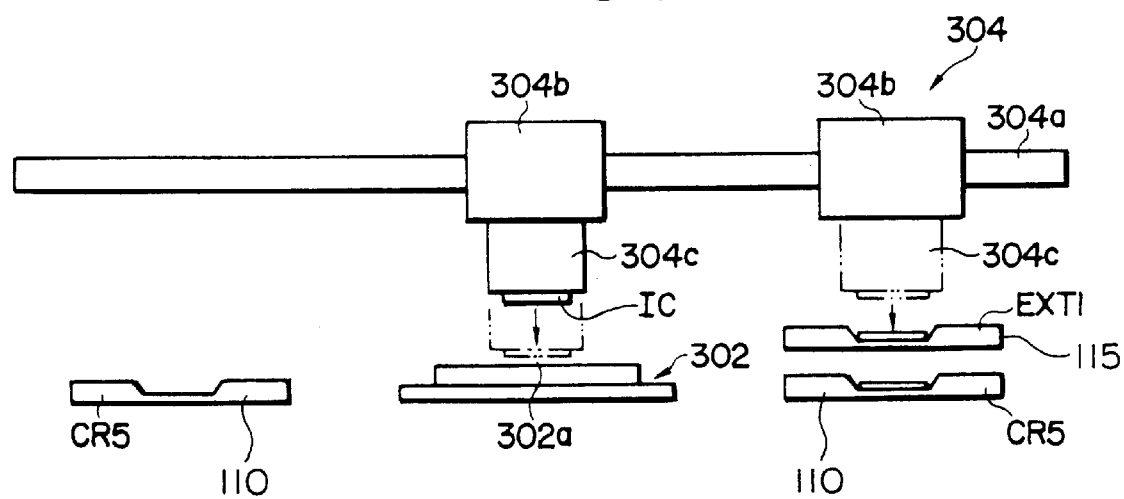

In the IC tester 1 of the present embodiment, a third transfer mechanism 304 is provided near the test head 302 for transferring the IC chips to the contact sections 302a of the test head 302 for testing. FIG. 18A and FIG. 18B are sectional views along the line XVIII—XVIII of FIG. 3. The third transfer mechanism 304 is provided with a rail 304a provided at the stop positions CR5 of the IC test trays 110 and along the direction of extension (Y-direction) of the test head 302, movable heads 304b able to move back and forth between the test head 302 and the stop positions of the IC test trays 110 by the rail 304a, and suction heads 304c provided facing downward at the movable heads 304b. The suction heads 304c are comprised to be able to move in the vertical direction Z as well by a not shown drive (for example, a fluid pressure cylinder). The vertical movement of the suction heads 304c enables the IC chips to be picked up and the IC chips to be pushed against the contact sections 302a.

In the third transfer mechanism 304 of the present embodiment, two movable heads 304b are provided on a single rail 304a. The interval between them is set equal to the interval between the test head 302 and the stop positions CR5 of the IC test trays 110. These two movable heads 304b move simultaneously in the Y-direction by a single drive source (for example, a ball-screw mechanism), while the suction heads 304c move in the vertical direction by independent drives.

As explained above, the suction heads 304c can pick up and hold eight IC chips at one time and the interval between them is set equal to the interval between contact sections 302a.

(Unloader Section 400)

As shown in FIG. 3, the unloader section 400 is provided with eject trays 115 for ejecting the post-test IC chips from the chamber section 300. The eject trays 115, as shown in FIG. 3 and FIG. 18, are configured to be able to move back and forth in the X-direction between the positions EXT1 at the two sides of the test head 302 and positions EXT2 of the unloader section 400. At the positions EXT1 at the two sides of the test head 302, as shown in FIG. 18A and FIG. 18B, the eject trays 115 appear and retract superposed somewhat above the stationary positions CR5 of the IC test trays 110 and somewhat below the suction heads 304c of the third transfer mechanism 304 to avoid interference with the IC test trays 110.

The specific structure of the eject trays 115 is not particularly limited, but they may be comprised by a tray body formed with a plurality of indentations able to receive the IC chips (here, eight) such as the IC test tray 110 shown in FIG. 7.

A total of two eject trays 115 are provided at the two sides of the test head 302. They operate substantially symmetrically with one moving to a position EXT2 of the unloader section 400 while the other is moving to a position EXT1 of the chamber body 301.

Returning to FIG. 3, a hot plate 401 is provided close to a position EXT2 of an eject tray 115. The hot plate 401 is for heating the IC chips to a temperature of an extent not causing condensation when a low temperature thermal stress has been applied to the IC chips. Therefore, there is no need to use the hot plate 401 when a high temperature thermal stress has been applied.

The hot plate 401 of the present embodiment is designed to be able to hold two columns and 16 rows of IC chips, a total of 32, corresponding to the ability of the suction heads 404d of the later mentioned fourth transfer mechanism 404 to hold eight IC chips at one time. The hot plate 401 is divided into four regions corresponding to the suction heads 404d of the fourth transfer mechanism 404. The eight post-test IC chips picked up and held from an eject tray 115 moved to the position EXT2 outside the chamber are placed on these regions in order. The eight IC chips heated the longest are picked up by the suction heads 404d in that state and transferred to a buffer section 402.

Figure 19:
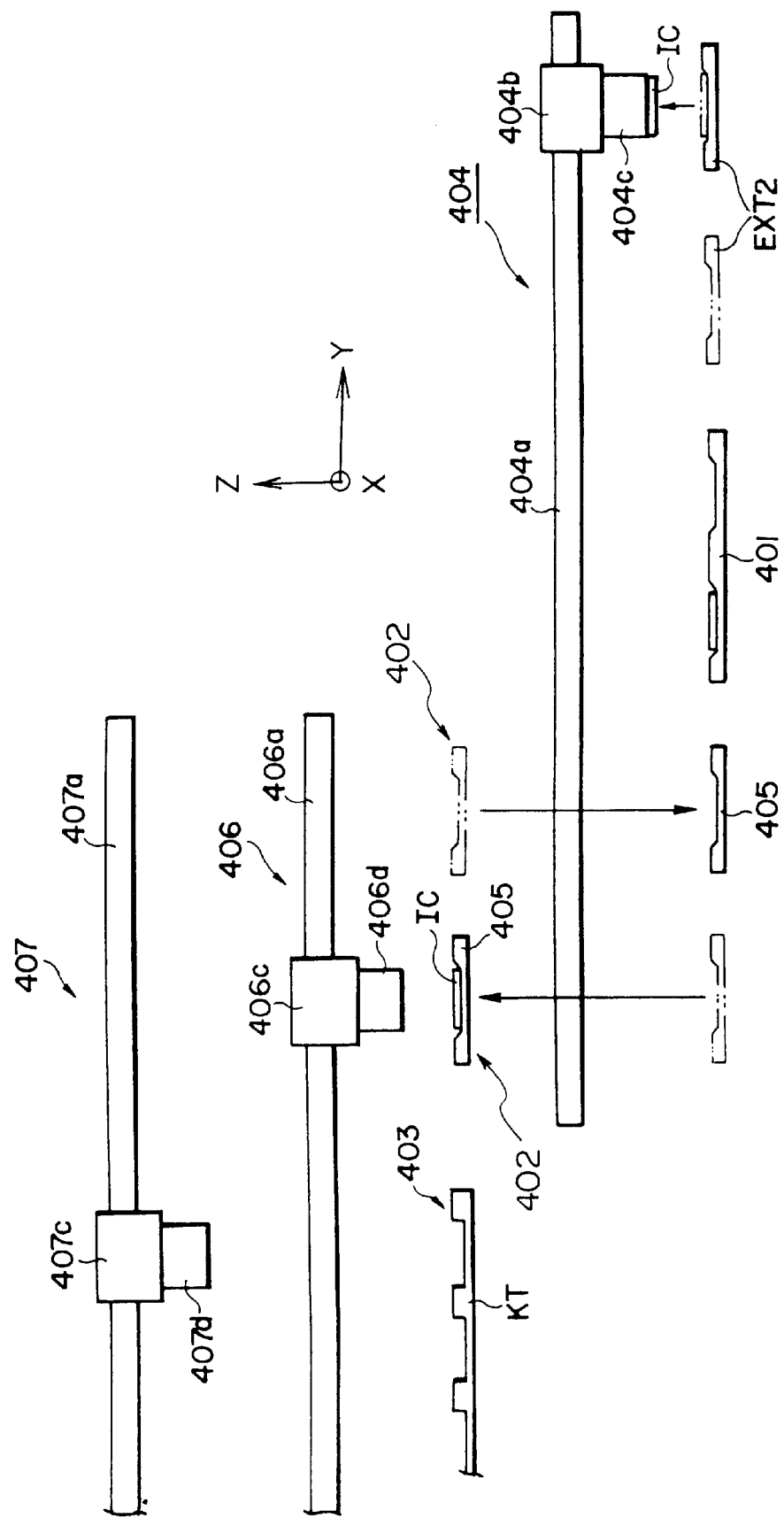
FIG. 19 is a schematic view for explaining the method of handling of an IC chip in an unloader section of an IC tester.

As shown in FIG. 19, near the hot plate 401 are provided two buffer sections 402 each having an elevator table 405. FIG. 19 is a sectional view along the line XIX—XIX of FIG. 3. The elevator tables 405 of the buffer sections 402 move in the Z-direction between a level the same as the eject carriers 115 positioned at the positions EXT2 and the hot plate 401 (Z-direction) and a level above the same, specifically the level of the test board 201. The specific structure of the buffer sections 402 is not particularly limited, but for example the sections may be configured by tray bodies formed with a plurality of (here, eight) indentations able to hold the IC chips in the same way as the IC test trays 110 and the eject trays 115.

This pair of elevator tables 405 operate substantially symmetrically, that is, while one is stopped at the elevated position, the other is stopped at the descended position.

The unloader section 400 stretching from the positions EXT2 of the eject trays 115 outside of the chamber to the buffer sections 402 explained above is provided with a fourth transfer mechanism 404. The fourth transfer mechanism 404, as shown in FIG. 3 and FIG. 19, is provided with a rail 404a laid above the test board 201, a movable arm 404b able to move in the Y-direction between the position: EXT2 of the eject trays 115 outside the chamber and the buffer sections 402 by the rail 404a, and suction heads 404c supported by the movable arm 404b and able to move vertically in the Z-direction with respect to the movable arm 404b. The suction heads 404c draw out air and move in the Z-direction and Y-direction to pick up IC chips from the eject trays 115 at the positions EXT2 and drop the IC chips on to the hot plate 401 and to pick up IC chips from the hot plate 401 and drop the IC chips to the buffer sections 402. There are eight suction heads 404c attached to the movable arm 404b in this embodiment, therefore it is possible to transfer eight IC chips at one time.

As shown in FIG. 19, the movable arm 404b and the suction heads 404c are set at positions enabling them to pass through a level between the elevated position and descended position of the elevator tables 405 of the buffer sections 402. By this, even if one elevator table 405 is at its elevated position, it is possible to transfer the IC chips to the other elevator table 405 without interference.

Further, the unloader section 400 is provided with a fifth transfer mechanism 406 and a sixth transfer mechanism 407. These fifth and sixth transfer mechanisms 406, 407 reload the post-test IC chips carried out to the buffer sections 402 to the customer trays KT.

Therefore, the test board 201 is formed with a total of four windows 403 for arranging the empty customer trays KT carried from the empty stocker EMP of the IC magazine 100 to be close to the top surface of the test board 201.

The fifth transfer mechanism 406, as shown in FIG. 1, FIG. 3, and FIG. 19, is provided with a rail 406a laid above the test board 201, a moveable arm 406b which can move in the Y-direction between the buffer sections 402 and windows 403 by the rail 406a, a movable head 406c which is supported by the movable arm 406b and can move in the X-direction with respect to the movable arm 406b, and suction heads 406d which are attached to the movable head 406c facing downward and can move vertically in the Z-direction. The suction heads 406d draw out air and move in the X-, Y- and Z-directions to pick up IC chips from the buffer sections 402 and transfer the IC chips to customer trays KT of corresponding categories. Two suction heads 406d are attached to the movable head 406c in this embodiment so it is possible to transfer two IC chips at one time.

Note that the fifth transfer mechanism 406 of the present embodiment is formed with a short movable arm 406b so as to transfer IC chips to only customer trays KT set at the two windows 403 at the right end. This is effective when setting customer trays KT of categories with high frequencies of occurrence at the two windows 403 at the right end.

As opposed to this, the sixth transfer mechanism 406, as shown in FIG. 1, FIG. 3, and FIG. 19, is provided with two rails 407a, 407a laid above the test board 201, a movable arm 407b which can move in the Y-direction between the buffer sections 402 and windows 403 by these rails 407a, 407a, a movable head 407c which is supported by the movable arm 407b and can move in the X-direction with respect to the movable arm 407b, and suction heads 407d which are attached to the movable head 407c facing downward and can move vertically in the Z-direction. The suction heads 407d draw out air and move in the X-, Y- and Z-directions to pick up IC chips from the buffer sections 402 and transfer the IC chips to customer trays KT of corresponding categories. Two suction heads 407d are attached to the movable head 407c in this embodiment so it is possible to transfer two IC chips at one time.

The above-mentioned fifth transfer mechanism 406 can transfer IC chips to only customer trays KT set at the two windows 403 at the right end, while the sixth transfer mechanism 407 can transfer IC chips to customer trays KT set at all of the windows 403. Therefore, IC chips of categories with high frequencies of occurrence may be classified using the fifth transfer mechanism 406 and the sixth transfer mechanism 407 and IC chips of categories with low frequencies of occurrence may be classified by only the sixth transfer mechanism 407.

To prevent the suction heads 406d, 407d of the two transfer mechanisms 406, 407 from interfering with each other, as shown in FIG. 1 and FIG. 19, these rails 406a, 407a are provided at different heights so that even if two suction heads 406d, 407d operate simultaneously, there will be almost no interference. In this embodiment, the fifth transfer mechanism 406 is set at a position lower than the sixth transfer mechanism 407.

Note that while not shown, elevator tables for elevating or lowering customer trays KT are provided below the test board 201 at the windows 403. A customer tray KT becoming full after being reloaded with the post-test IC chips is placed on there and lowered, the full tray is passed to the tray transfer arm, and the tray transfer arm is used to carry it to the corresponding stocker UL1 to UL5 of the IC magazine 100. Further, an empty customer tray KT is carried from the empty stocker EMP by the tray transfer arm to a window 403 which has become empty after the ejection of a customer tray KT, placed on the elevator table, and set at the window 403.

One buffer section 402 of the present embodiment is able to hold 16 IC chips. Further, provision is made of a memory for storing the categories of the IC chips held at the IC holding positions of the buffer section 402.

Further, the categories and positions of the IC chips stored at a buffer section 402 are stored for each IC chip, customer trays KT of categories to which the IC chips stored at a buffer section 402 belong are called up from the IC magazine 100 (UL1 to UL5), and the IC chips are received in the corresponding customer trays KT by the above-mentioned fifth and sixth transfer mechanisms 406, 407.

Next, the operation will be explained.

The stocker LD of the IC magazine 100 stores customer trays KT on which pre-test IC chips are carried. The customer trays KT are set at the windows 202 of the loader section 200. For example, four IC chips are picked up at one time from a customer tray KT brought close to the top surface of the test board 201 using the first transfer mechanism 204. These are dropped once at the pitch conversion stage 203 to correct the positions and change the pitch of the IC chips.

Next, the second transfer mechanism 205 is used to pick up for example four IC chips dropped at the pitch conversion stage 203 at one time, carry them from the inlet 303 to the inside of the chamber body 301, and load them on IC test trays 110 stationary at positions CR1. There are two transfer positions CR1 inside the chamber body 301, so the second transfer mechanism 205 alternately carries IC chips to the IC test trays 110 at these two positions. At this time, the shutters 15 of the IC test trays 110 are opened or closed by fluid pressure cylinders 182 (see FIG. 6).

When 16 IC chips have been loaded at the positions CR1, the IC test trays 110 are conveyed in the chamber body 301 by the sequence CR1→CR2→. . . →CR4 shown in FIG. 6. During this time, a high temperature or low temperature thermal stress is given to the IC chips.

When IC test trays 110 on which pre-test IC chips are loaded are carried to the positions CR5 at the two sides of the test head 302, the shutters 15 of the IC test trays 110 are opened by the stoppers 183 shown in FIG. 12. As shown in FIG. 18A, one of the suction heads (left side in FIG. 18A) of the third transfer mechanism 304 descends and picks up every other IC chip (see FIG. 17) and then rises again and stands by there. Simultaneously with this, the other suction head (right side in FIG. 18A) 304c presses the eight picked up IC chips against the contact sections 302a of the test head 302 for the test.

At this time, there is no eject tray 115 (shown by two-dot chain lines in the figure) at the position EXT1 above the IC test tray 110 at the position CR5 of the left side in FIG. 18A. It has moved to a position EXT2 (see FIG. 3) outside of the chamber body 301. Further, there is an eject tray 115 at the position EXT1 above the IC test tray 110 at the right side position CR5. This stands by until the end of the tests on the IC chips picked up by the right side suction heads 304c.

When the tests on the eight IC chips picked up by the right side suction heads 304c end, as shown in FIG. 18B, these movable heads 304b, 304b are made to move to the right side and press the eight IC chips picked up by the left side suction heads 304c to the contact sections 302a of the test head 302.

On the other hand, the eight post-test IC chins picked up by the right side suction heads 304c are loaded on the standing by eject tray 115. Next, the eject tray 115 loaded with the post-test IC chips is moved from a position EXT1 of the chamber body 301 to a position EXT2 outside of the chamber body 301.

When an eject tray 115 is moved outside of the chamber body 301 in this way, the right side suction heads 304c descend toward the IC test tray 110 at the right side position CR5, pick up the remaining eight IC chips, rise again, then stand by until the end of the tests on the IC chips picked up by the left side suction heads 304c. Before the suction heads 304c pick up the chips, the IC test tray 110 moves by exactly the pitch P1 (see FIG. 17) so that the remaining IC chips can be picked up by the suction heads 304c.

Around this time, the eject tray 115 at the left side of FIG. 18B moves to the inside of the chamber body 301 and stands by at a position EXT1 until the end of the tests on the IC chips picked up by the left side suction heads 304c.

When the tests on the IC chips picked up by the left side suction heads 304c in this way end, the movable heads 304b, 304b are made to move to the left side and press the remaining eight IC chips picked up by the right side suction heads 304c against the contact sections 302a of the test head 302.

On the other hand, the eight post-test IC chips picked up by the left side suction heads 304c are loaded on the standing by eject tray 115, then the eject tray 115 loaded with the post-test IC chips moves from the position EXT1 inside the chamber body 301 to a position EXT2 outside the chamber body 301.

This operation is repeated, but since one contact section 302a is alternately accessed by two suction heads 304c in this way and one stands by until the test of the other has been finished, the time for an IC chip to be picked up by one suction head 304c is absorbed in the test time of the other and therefore the index time can be shortened by that extent.

On the other hand, eight IC chips finished being tested at the test head 302 are alternately ejected at one time by the two eject trays 115 to positions EXT2 outside of the chamber body 301.

As shown in FIG. 19, the eight post-test IC chips ejected to the right side position EXT2 by an eject tray 115 are picked up all together by the suction heads 404c of the fourth transfer mechanism 404 and loaded on one region of the four regions of the hot plate 401. Note that in this embodiment, the explanation is made assuming a case of applying a low temperature thermal stress. When applying a high temperature thermal stress, the IC chips are directly carried from an eject tray 115 to a buffer section 402.

The suction heads 404c of the fourth transfer mechanism 404 which carried the post-test IC chips to one region of the hot plate 401 do not return to their original positions. They pick up the eight IC chips for which the longest time has elapsed among the post-test IC chips placed on the hot plate before then at that position and then reload the heated post-test IC chips at an elevator table 405 (right side in FIG. 19) of a buffer section 402 at the descended position.

As shown in FIG. 19, the left side elevator table 405 loaded with the eight post-test IC chips by the prior operation of the fourth transfer mechanism 404 moves to the elevated position. Along with this, the right side elevator table 405 moves to the descended position. The left side elevator table 405 moving to the elevated position is loaded with eight post-test IC chips. These post-test IC chips are transferred by the fifth and sixth transfer mechanisms 406, 407 to customer trays KT of corresponding categories in accordance with the test results stored. FIG. 19 shows an example of reloading post-test IC chips by the fifth transfer mechanism 406 on customer trays KT.

By repeating this operation subsequently, the post-test IC chips are reloaded on customer trays KT of corresponding categories, but by arranging the fourth transfer mechanism 404 and the fifth or sixth transfer mechanism 406, 407 at positions of different levels in the unloader section 400, it is possible to make the fourth transfer mechanism 404 and the fifth and sixth transfer mechanisms 406, 407 operate simultaneously and thereby improve the throughput.

Second Embodiment

In this embodiment, the explanation will be made of a tray vertical carrier realizing the electronic device tray transporting apparatus according to the first aspect of the present invention and an IC test tray realizing the electronic device tray according to the third aspect of the present invention.

As shown in FIGS. 20 to 23, the tray vertical carrier 35O according to the present embodiment is an apparatus for conveying an IC test tray 110 in the substantially vertical direction and for example is an apparatus for moving an IC test tray 110 in the substantially vertical direction inside the chamber section shown in FIG. 6.

An IC test tray 110 has projections 120 at the four corners of the bottom surface. These projections 120 are for forming spaces among IC test trays 110 when a plurality of IC test trays 110 are stacked together.

The basic configuration of the IC test tray 110 is the same as the IC test tray 110 shown in FIG. 7, FIG. 8A, and FIG. 8B.

Figure 20:
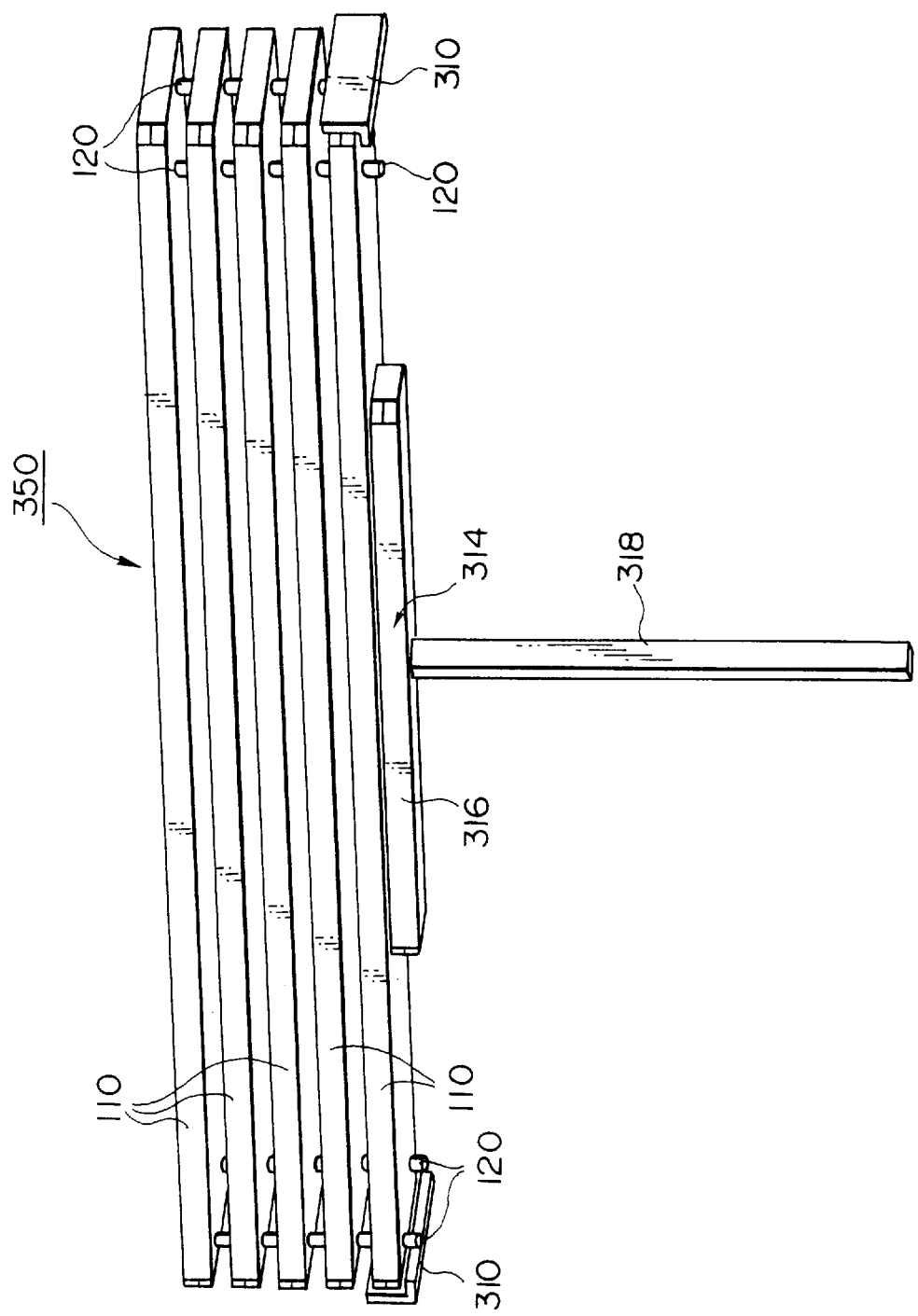
FIGS. 20 to 23 are schematic perspective views of a tray vertical carrier according to the first embodiment of the present invention.

As shown in FIG. 20, the tray vertical carrier 350 according to the present embodiment has a pair of tray end holding members 310 and a tray elevating member 314. The tray end holding members 310 are rails able to detachably hold the two ends of the lowermost level IC test tray 110 in the longitudinal direction positioned at the lowermost level.

The tray elevating member 314 has a tray bottom surface holding plate 316 and an elevator rod 318 with a top end connected to the tray bottom surface holding plate 316. The elevator rod 318 can move in the vertical direction by a pressure cylinder or other actuator member, not shown.

Figure 21:
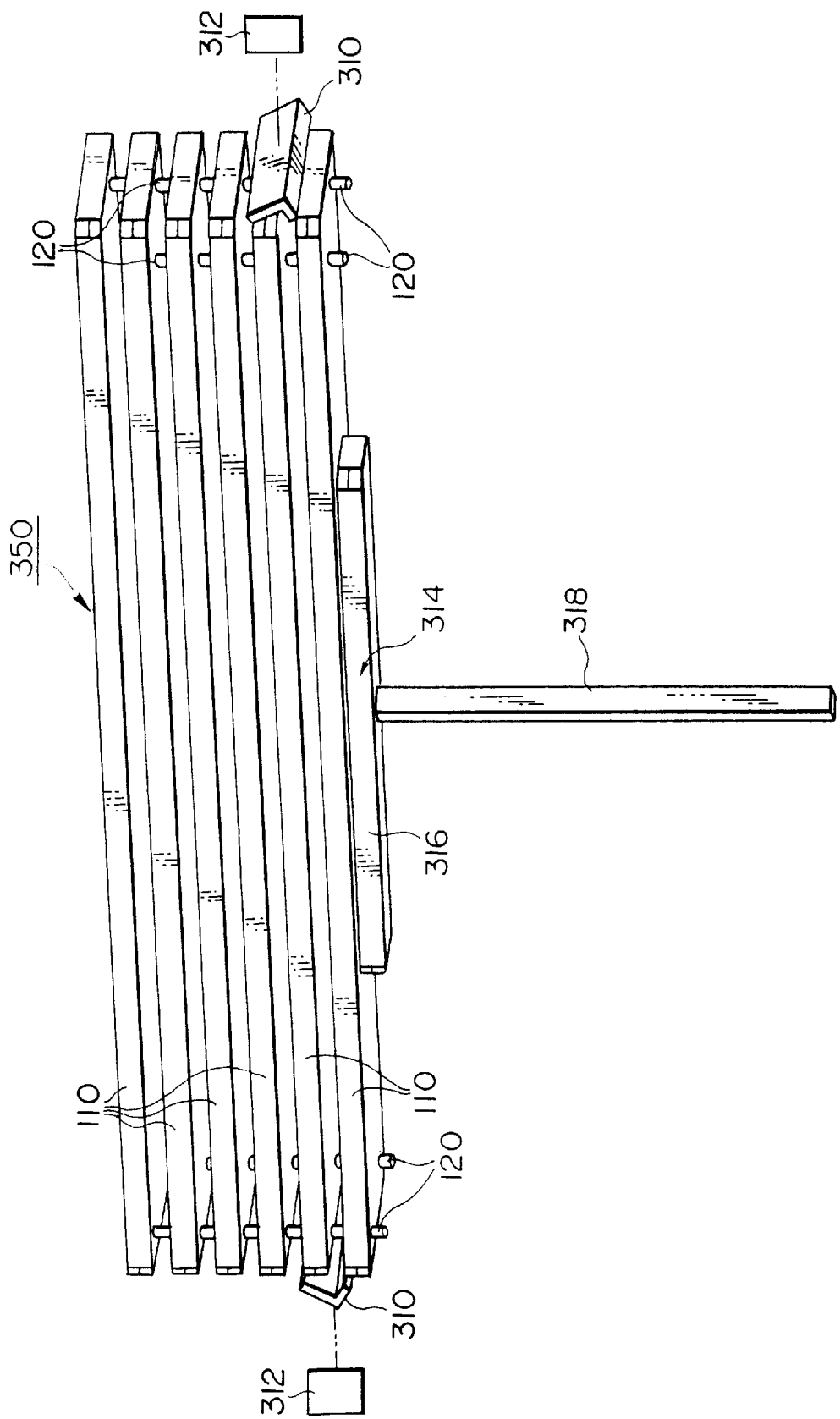
Figure 22:
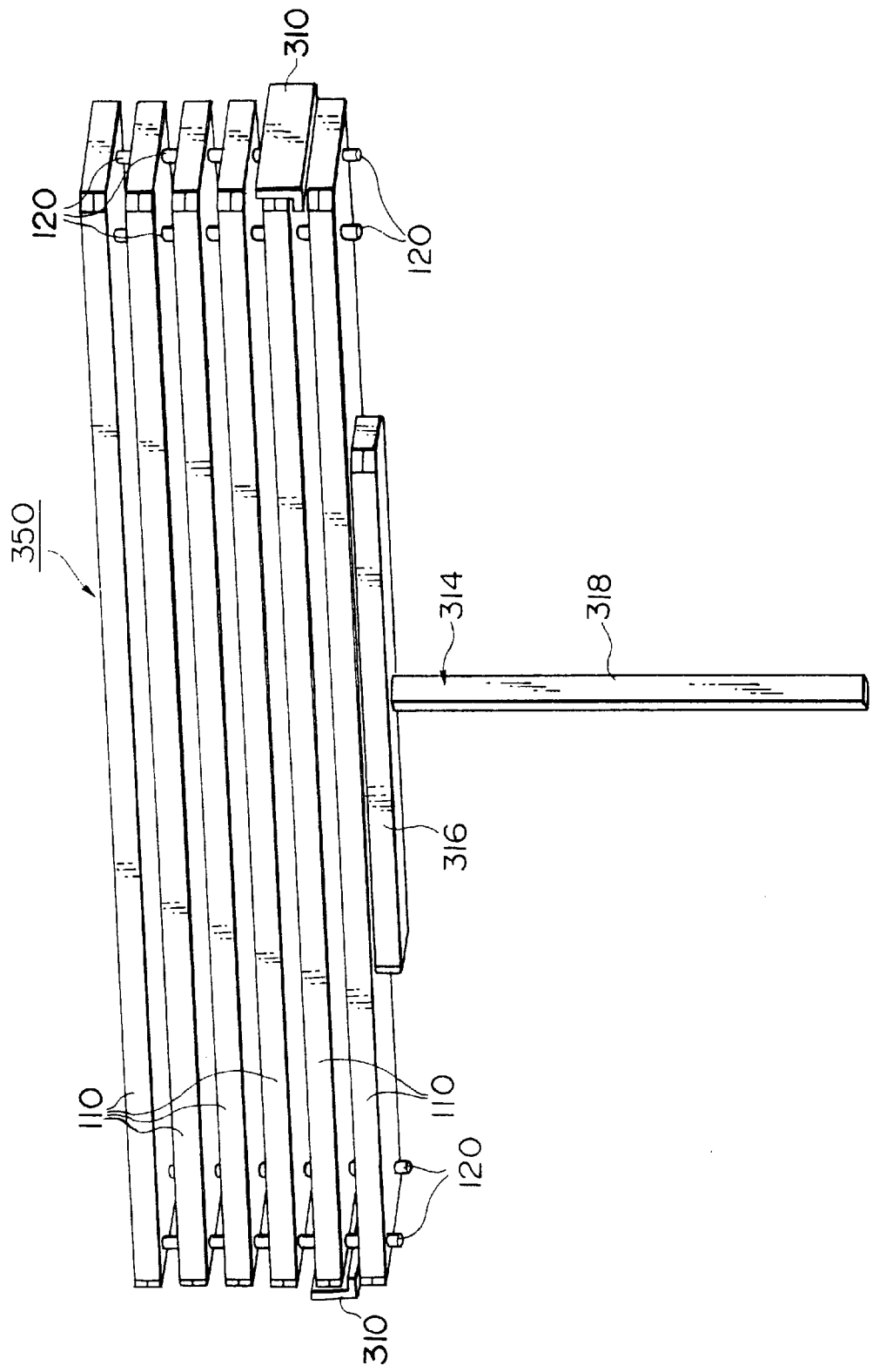

The tray end holding members 310, as shown in FIG. 21, are driven by pressure cylinders or other actuator members 312. When the tray elevating member 314 abuts against the bottom surface of the lowermost level tray 110 and that lowermost level tray 110 can be supported by the tray elevating member 314, the hold on the lowermost level tray 110 by the tray end holding members 310 can be released. Further, as shown in FIG. 22, the tray end holding members 310 are designed so that they can be then driven by the actuator members 312 and hold the two ends of another IC test tray 110 next arriving at the lowermost level position.

Figure 23:
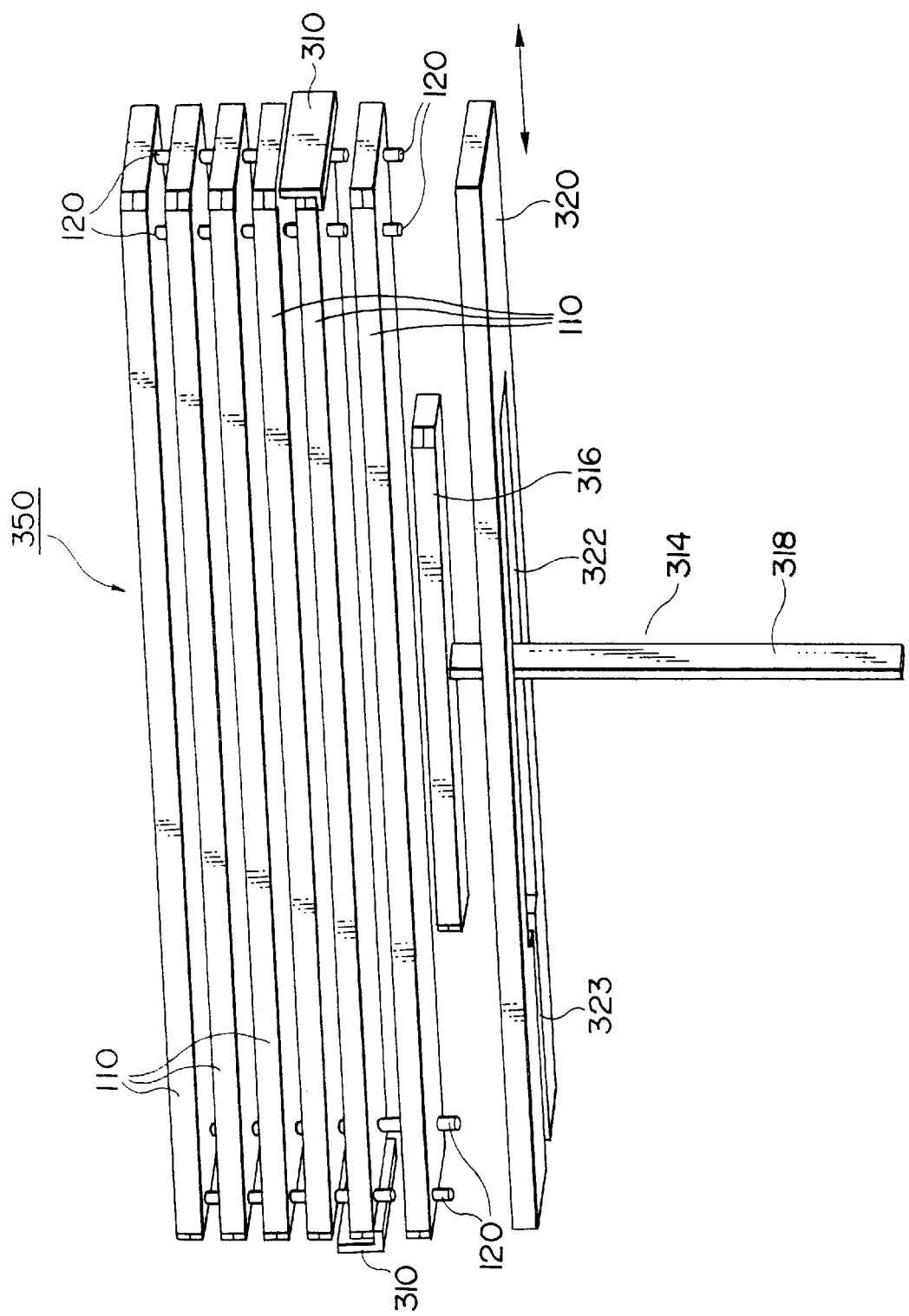

As shown in FIG. 23, below the tray end holding members 310 is arranged a horizontal carrier 320 having an opening 322 enabling the tray elevating member 314 to pass through it so as not to interfere with the elevating motion of the tray elevating member 314. By the tray elevating member 314 descending while carrying the lowermost level IC test tray 110, the IC test tray 110 is placed on the horizontal carrier 320. When the tray elevating member 314 passes through the opening 322 and moves sufficiently downward, the tray horizontal carrier 320 can move in the horizontal direction along the longitudinal direction in the state carrying the IC test tray 110. The IC test tray 110 is then conveyed in the horizontal direction. Note that even when the tray elevating member 314 does not sufficiently move downward after passing through the opening 322 to the tray horizontal carrier 320, by providing a cutaway portion 323 communicating with the opening 322, it is possible to allow horizontal movement of the tray horizontal carrier 320. This is because the elevator rod 318 of the tray elevating member 314 passes through the cutaway portion 323.

In the present embodiment, the drive means for conveying the tray horizontal carrier 320 in the horizontal direction is not particularly limited. A belt conveyor etc. is used. Note that even a belt conveyor or other drive means must be provided so as not to interfere with the elevating motion of the tray elevating member 314.

With the tray vertical carrier 350 according to the present embodiment, IC test trays 110 are successively stacked on the lowermost level IC test tray 110 held by the tray end holding members 310. Unlike in the related art, each of the stacked IC test trays 110 is not held by tray end holding members. Therefore, when the number of the IC test trays to be stacked is small, only the lowermost level IC test tray 110 among the small number of stacked IC test trays 110 is held by the tray end holding members 310.

When the tray elevating member 314 abuts against the bottom surface of the lowermost level tray 110 among the stacked IC test trays 110 and that lowermost level tray 110 can be supported by the tray elevating member 314, the tray end holding members 310 are driven by the actuator members 312 and the hold on the lowermost level tray 110 by the tray end holding members 310 is released. Further, by again driving the tray end holding members 310 by the actuator members 312, the tray end holding members 310 hold the two ends of another IC test tray 110 next arriving at the lowermost level position.

The lowermost level IC test tray 110 held by the tray elevating member 314 is conveyed downward by the tray elevating member 314, placed on the tray horizontal carrier 320 for example, and conveyed in the substantially horizontal direction. In this way, the IC test trays 110 positioned at the lowermost level among the stacked IC test trays 110 are successively conveyed by the tray elevating member 314. Therefore, when the number of stacked IC test trays 110 is small, an IC test tray 110 is conveyed from the uppermost level to the lowermost level in a time of only the time corresponding to the number of trays stacked.

Further, the tray vertical carrier 350 of the present embodiment is simple in mechanism, so is fast in operating speed. Note that in the above example, the case was shown of use of the tray vertical carrier 350 to successively convey downward the lowermost level trays 110 among the stacked IC test trays, but in the present invention a reverse operation to the operation described above is also possible. That is, it is also possible to use the tray elevating member 314 to lift upward an IC test tray 110 conveyed from the horizontal direction by the tray horizontal carrier 320 and successively add trays to the lowermost level position of the stacked IC test trays 110. In this case, the tray end holding members 310 release the hold on the tray ends in the state where the top surface of an IC test tray 110 lifted up by the tray elevating member 314 contacts the projections 120 of the stacked IC test trays 110 and becomes held. Next, all of the stacked IC test trays 110 are lifted up one level by the elevating member 314 and the tray end holding members 310 hold the two ends of the IC test tray 110 next arriving at the lowermost level position. Next, the elevating member 314 moves downward. The IC test tray 110 positioned at the uppermost level among the IC test trays 110 held and stacked by the tray end holding members 310 is conveyed to another position by another transfer mechanism.

Third Embodiment

In this embodiment, an explanation will be made of a tray horizontal carrier realizing the second electronic device tray transporting apparatus according to the present invention.

Figure 24:
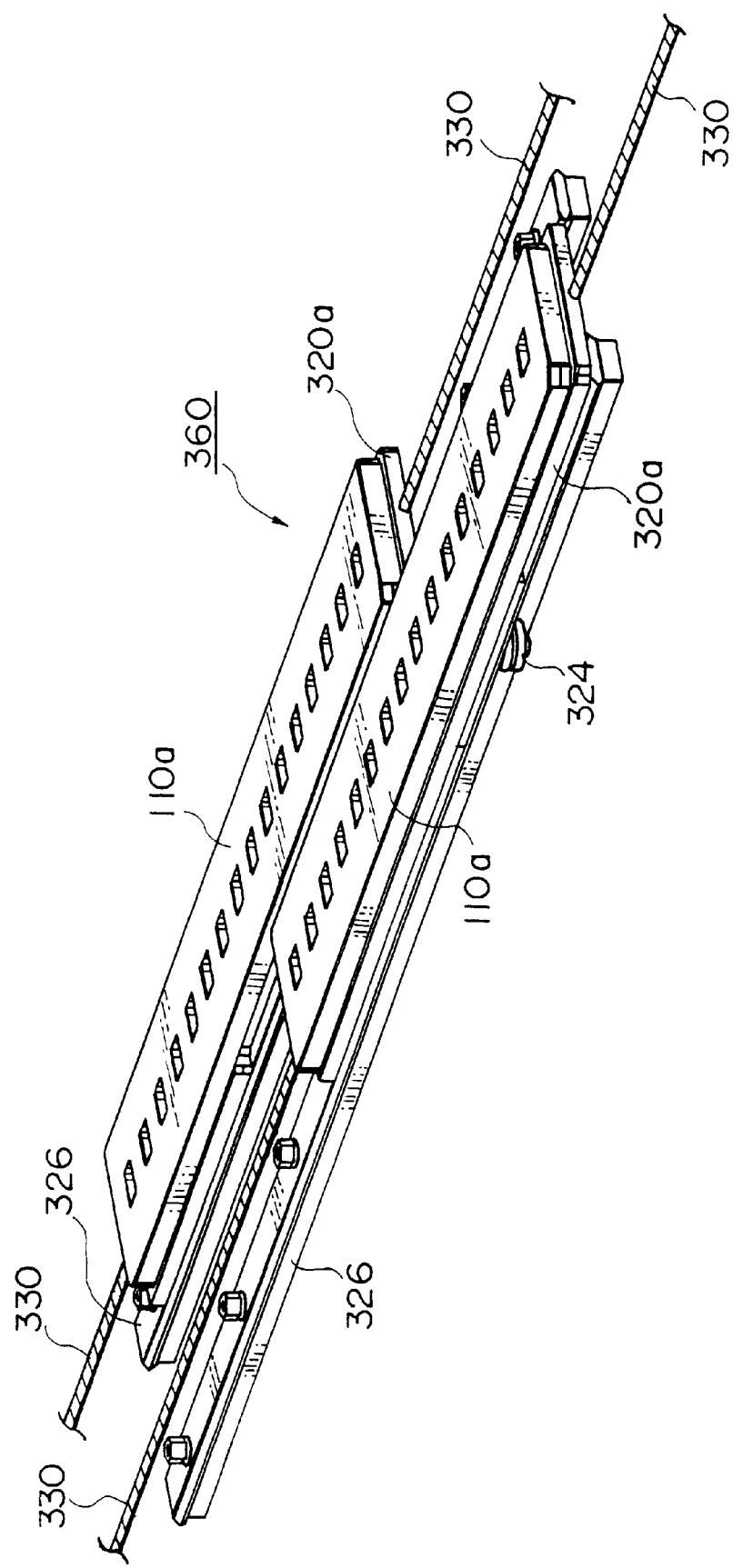
FIG. 24 and FIG. 25 are perspective views of a tray horizontal carrier according to the first embodiment of the present invention.
Figure 25:
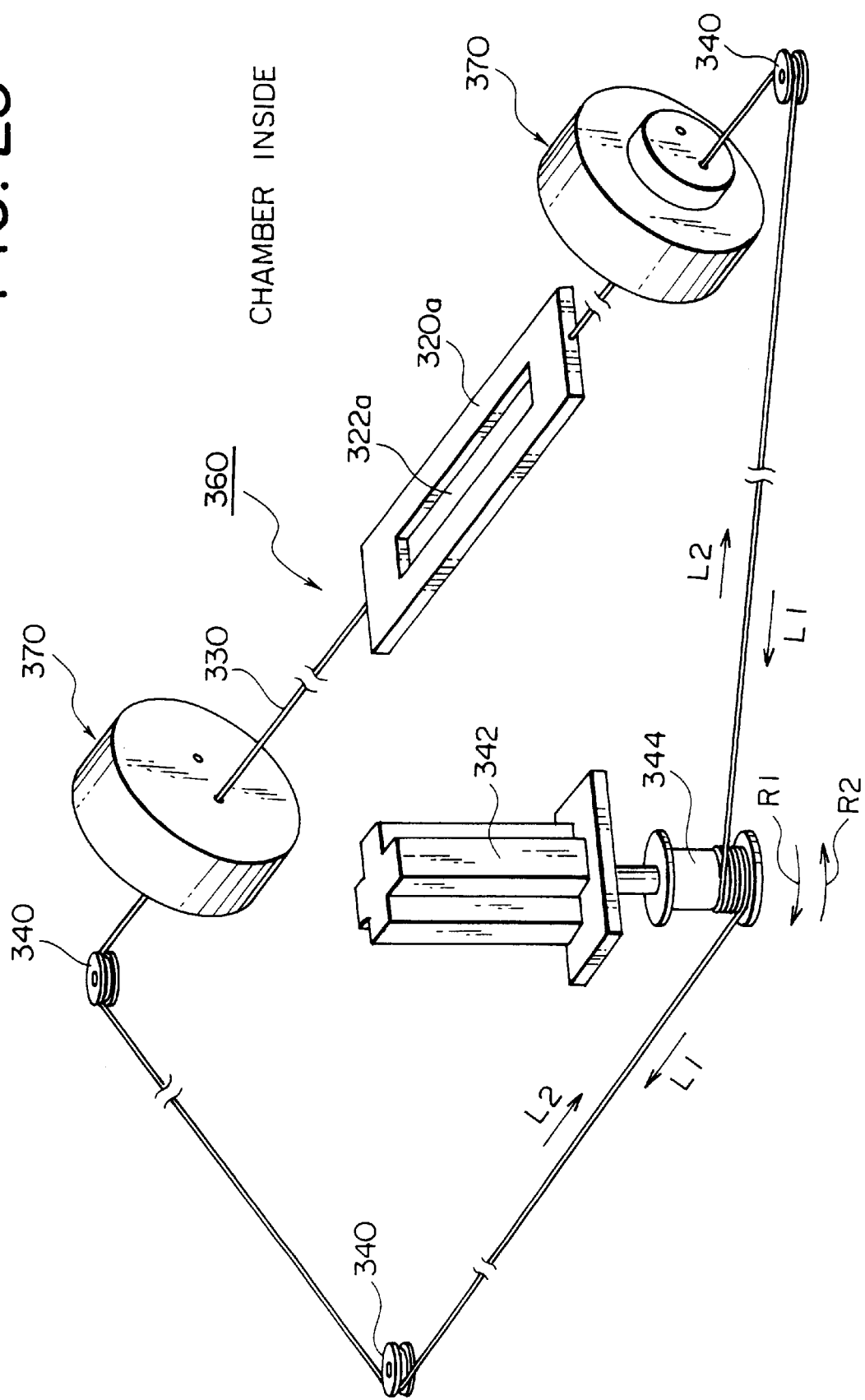

The tray horizontal carrier 360 according to the present embodiment shown in FIG. 24 and FIG. 25 is used for conveying an TC test tray 110 in the substantially horizontal direction inside the chamber section shown in FIG. 6 for example.

The tray horizontal carrier 360 of this embodiment is provided with an elongated plate-shaped tray horizontal carrier 320a on which an IC test tray 110a can be detachably placed and a drive wire 330 for making the tray horizontal carrier 320a move in the horizontal direction along the longitudinal direction. In FIG. 24, a pair of tray horizontal carriers 320a, 320a are shown adjoining each other substantially in parallel, but FIG. 25 shows only one tray horizontal carrier 320a for simplification of the explanation.

As shown in FIG. 25, an opening 322a may also be formed in the tray horizontal carrier 320a. This opening 322a is for allowing the tray elevating member 314 to pass through it when using the tray horizontal carrier 360 in combination with the tray vertical carrier 350 as shown for example in FIG. 23.

An IC test tray 110a placed detachably on the tray horizontal carrier 320a shown in FIG. 24 may be the same or different as the IC test tray 110 shown in FIG. 7. Whatever the case, the IC test tray 110a can hold at least one IC chip, preferably a plurality of IC chips.

Figure 26:
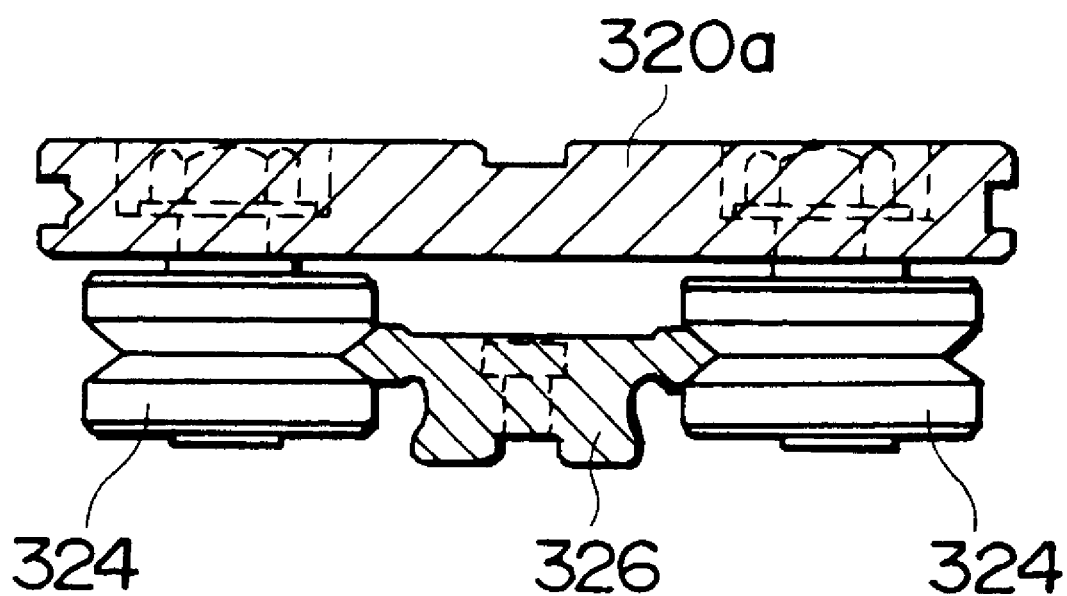
FIG. 26 is a sectional view of key parts of a rail shown in FIG. 24.

As shown in FIG. 24 and FIG. 26, a plurality of roller bearings 324 are attached to the bottom surface of the tray horizontal carrier 320a. By the engagement of these roller bearings 324 with the rail 326, the tray horizontal carrier 320a can move in the substantially horizontal direction along the longitudinal direction of the rail 326.

As shown in FIG. 24 and FIG. 25, the two ends of the drive wire 330 are connected to the two ends of the tray horizontal carrier 320a in the longitudinal direction. Further, the middle of the drive wire 330 is wound around a drive drum 344 of a drive motor 342 through a roller 340. For example, by making the drive drum 344 rotate in the direction of the arrow R1, the drive wire 330 moves in the direction of the arrow L1. In the case of the reverse direction of rotation R2, it moves in the opposite direction of the arrow L2. As a result, the tray horizontal carrier 320a can move back and forth along the rail 326 shown in FIG. 24. Note that while omitted in FIG. 25, to prevent slackness of the drive wire 330, it is also possible to attach a tensioner imparting tension to the drive wire 330.

In the tray horizontal carrier 360 according to the present embodiment, the tray horizontal carrier 320a is conveyed in the substantially horizontal direction by the drive wire 330, so by controlling the amount of movement of the drive wire 330 in the longitudinal direction, it is possible to make the tray horizontal carrier stop at an accurate position. The amount of movement of the drive wire in the longitudinal direction can be relatively easily controlled by using as the drive motor 342 for example a step motor or other motor able to be controlled in rotational angle or rotational speed. Further, the tray horizontal carrier 360 of the present embodiment differs from that of the related art in that it is not configured to make an IC test tray 110 stop by striking a stopper member, so the load acting on the IC test tray 110 is also small, the durability of the IC test tray 110 is improved, and there is less trouble. Further, since it is possible to make the tray horizontal carrier 320a stop at an accurate position by controlling the amount of movement of the drive wire 330 in the longitudinal direction, there is no need to provide a stopper member or sensor for each stopping position of the IC test tray 110, the configuration is simple, and there is less trouble in this regard as well.

Fourth Embodiment

Next, an explanation will be given of the case where tray vertical carriers 350 and tray horizontal carriers 360 of the above embodiments are arranged inside the chamber section in FIG. 6.

IC test trays 110 conveyed to the positions CR2 are conveyed to the positions CR3 in a state stacked in several levels toward the bottom in the vertical direction by the tray vertical carriers 350 shown in FIGS. 20 to 23. Mainly during this conveyance, a high temperature or low temperature thermal stress is given to the IC chips. The IC test trays 110 according to this embodiment are formed with projections 120. Since spaces are formed between the IC test trays, thermal stress is uniformly given to the stacked IC test trays 110 and the time until the temperatures of the IC chips become uniform is short. Next, the IC test trays at the positions CR5 in FIG. 6 stand by until being emptied, then are conveyed by the tray horizontal carriers 360 shown in FIG. 24 and FIG. 25 from the lowermost level position CR3 to the position CR4 of a level substantially the same as the test head 302.

Further, they are conveyed by the tray horizontal carriers 360 shown in FIG. 24 and FIG. 25 from the positions CR4 toward the test head 302 side to positions CR5 in the horizontal direction. There, only the IC chips are sent to the contact sections 302a of the test head 302. The IC test trays 110 from which IC chips have been sent to the contact sections 302a are then conveyed from the positions CR5 to the positions CR6 in the horizontal direction by the tray horizontal carriers 360 shown in FIG. 24 and FIG. 25. Next, they are conveyed by the tray vertical carriers 350 shown in FIGS. 20 to 23 upward in the vertical direction and return from the positions CR6 to the original positions CR1. With the tray vertical carriers 350 according to the present embodiment, even when there are few IC test trays 110 stacked in the path from the positions CR6 to CR1, this can be readily handled and the time of movement can be shortened. When there are few trays stacked, the positions CR1 are lower than the case where there are many. In this case, it is possible to use the tray elevating members 314 shown in FIG. 20 to raise the uppermost level IC test trays 110 higher and transfer the IC chips.

Fifth Embodiment

As shown in FIG. 25, an in-chamber member movement mechanism according to this embodiment is a tray horizontal carrier 360 for making an IC test tray arranged inside chamber walls comprised of an insulating material, not shown, be conveyed in the horizontal direction inside the chamber section. The inside of the chamber section is substantially isolated from the outside air and set to a predetermined temperature for low temperature tests or high temperature tests on the IC chips.

The tray horizontal carrier 360 of the present embodiment is provided with an elongated plate-shaped tray horizontal carrier 320a on which an IC test tray 110 shown in FIG. 7 or an IC test tray 110a shown in FIG. 24 can be detachably placed and a drive wire 330 for making the tray horizontal carrier 320a move in the horizontal direction along the longitudinal direction.

As shown in FIG. 25, the two ends of the drive wire 330 are connected to the two ends of the tray horizontal carrier 320a in the longitudinal direction. Further, the middle of the drive wire 330 is wound around a drive drum 344 of a drive motor 342 through a roller 340. For example, by making the drive drum 344 rotate in the direction of the arrow R1, the drive wire 330 moves in the direction of the arrow L1. In the case of the reverse direction of rotation R2, it moves in the opposite direction of the arrow L2. As a result, the tray horizontal carrier 320a can move back and forth along the LM guide rail inside the chamber section. Note that while omitted in FIG. 25, to prevent slackness of the drive wire 330, it is also possible to attach a tensioner imparting tension to the drive wire 330.

In the tray horizontal carrier 360 serving as the in-chamber member movement mechanism according to the present embodiment, the tray horizontal carrier 320a is conveyed in the substantially horizontal direction by the drive wire 330, so by controlling the amount of movement of the drive wire 330 in the longitudinal direction, it is possible to make the tray horizontal carrier stop at an accurate position. The amount of movement of the drive wire in the longitudinal direction can be relatively easily controlled by using as the drive motor 342 serving as the drive source for example a step motor or other motor able to be controlled in rotational angle or rotational speed. Further, the tray horizontal carrier 360 differs from that of the related art in that it is not configured to make an IC test tray 110 stop by striking a stopper member, so the load acting on the IC test tray 110a is also small, the durability of the IC test tray 110a is improved, and there is less trouble. Further, since it is possible to make the tray horizontal carrier 320a stop at an accurate position by controlling the amount of movement of the drive wire 330 in the longitudinal direction, there is no need to provide a stopper member or sensor for each stopping position of the IC test tray 110, the configuration is simple, and there is less trouble in this regard as well.

In the present embodiment, in this tray horizontal carrier 360, as shown in FIG. 25, the opposing chamber walls have cylindrically shaped insulating sleeves 370 attached to them. The thicknesses of the insulating sleeves 370 are made substantially the same as the thickness of the chamber walls. As the insulating material constituting the chamber walls, for example, ceramic fiber is used. The insulating sleeves 370 are constituted by for example a glass fiber reinforced epoxy resin etc.

Figure 27:
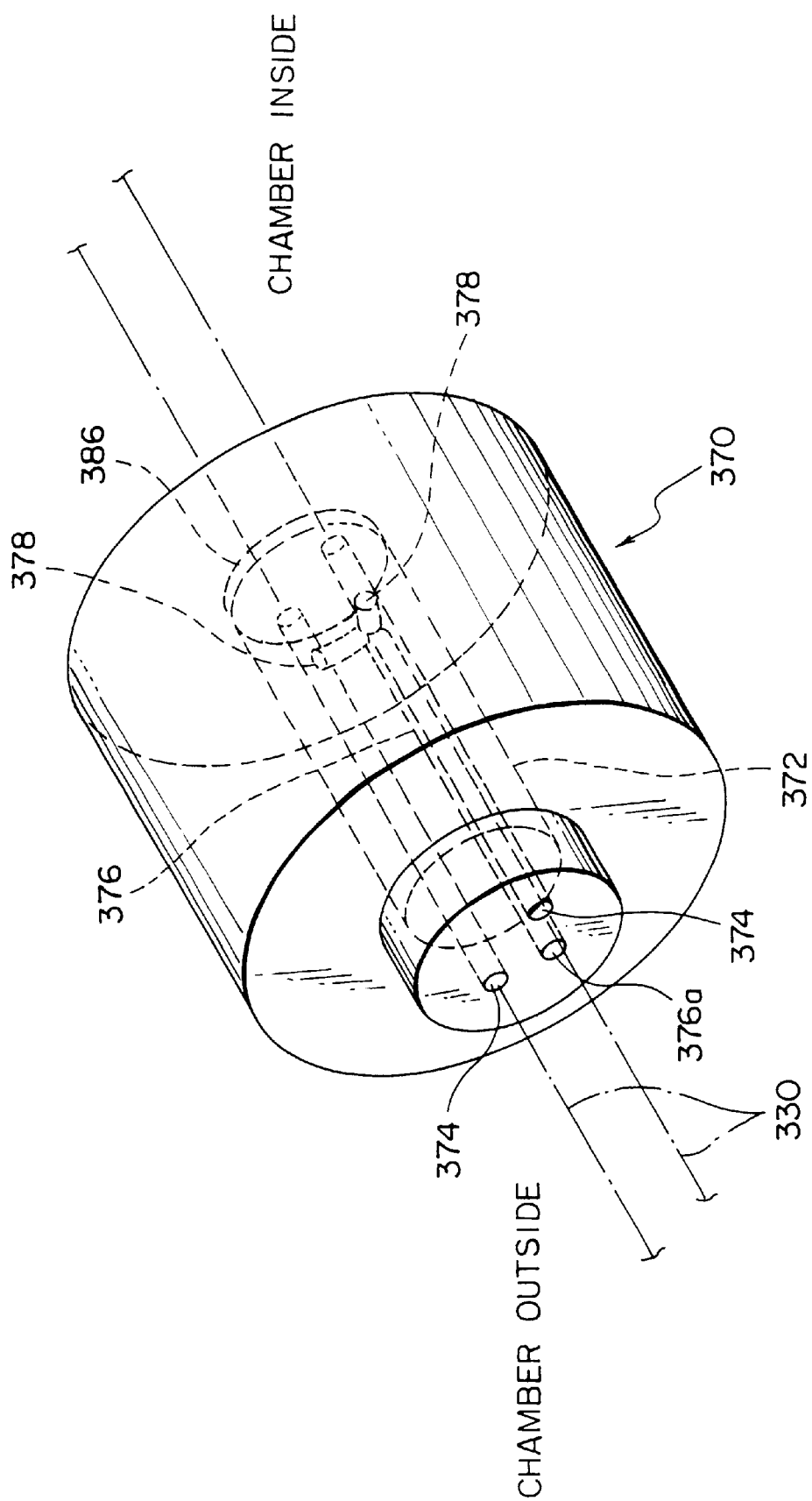
FIG. 27 is a perspective view of a drive wire introduction member with an insulating sleeve used for the in-chamber member movement mechanism according to the first embodiment of the present invention.

As shown in FIG. 27, the insulating sleeves 370 have buried in them drive wire introduction members 372 along their center axes. The drive wire introduction members 372 have formed in them pairs of through holes 374 parallel to the axial centers. Further, the through holes 374 have formed at their chamber inner sides blow holes 378 for blowing out dry air. The blow holes 378 are fed with dry air through dry air introduction holes 376. The introduction ports 376a of the dry air introduction holes 376 are connected to a dry air feed source. Dry air having a dew point about the same as or lower than the inside temperature of the chamber section is preferably fed. For example, when the inside of the chamber section is about −55° C., the dew point temperature of the dry air introduced inside the through holes 374 through the dry air introduction holes 376 is preferably −55° C. or a temperature lower than that.

Figure 28:
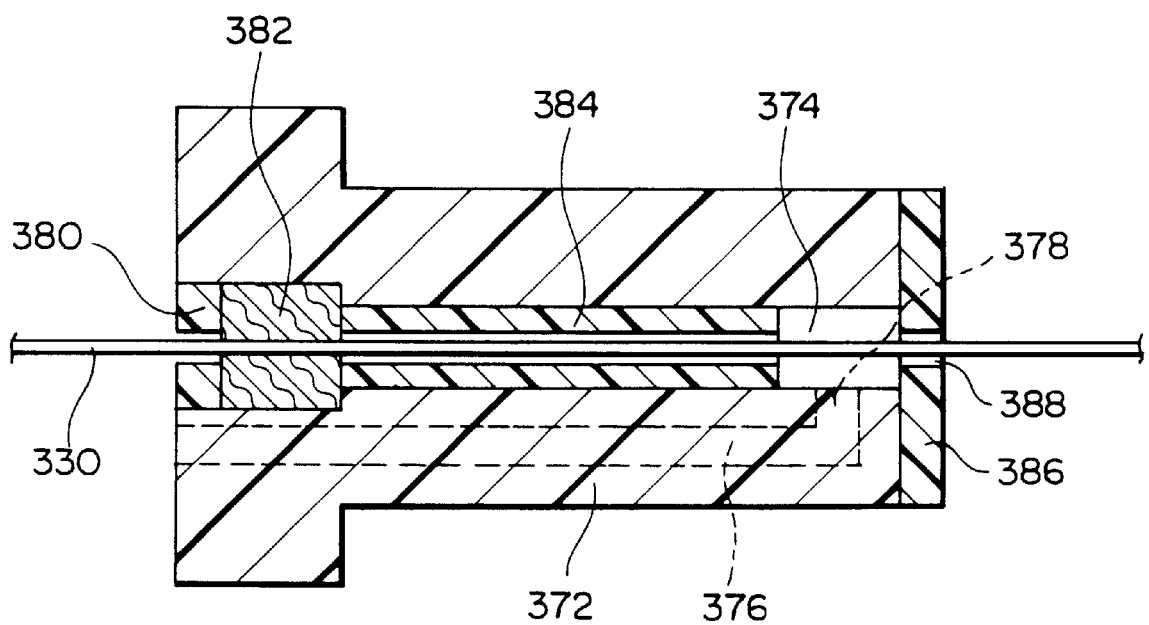
FIG. 28 is a sectional view of the drive wire introduction member shown in FIG. 27.

As shown in FIG. 28, a felt ring 382 serving as a moisture absorbing member is attached in a through hole 374 of the drive wire introduction member 372 at a position close to the outside of the chamber section and slides over the outer periphery of the drive wire 330. At the outside of the felt ring 382 is attached a silicone ring 380 serving as a seal member. This silicone ring 380 is accommodated together with the felt ring 382 inside a large diameter recess formed in the through hole 374 at the chamber outer side.

A plastic tube 384 superior in sliding properties such as a fluororesin is attached in the through hole 374 at the chamber inner side of the felt ring 382. The drive wire 330 passes through the axial direction space of this tube 384. The tube 384 is arranged so as not to block the dry air blow hole 378.

As shown in FIG. 28, a silicone disk 386 serving as a seal member is attached at the chamber inner side end of the drive wire introduction member 372. The silicone disk 386 is formed with a pair of through holes 388 communicating with the pair of through holes 374. The inner diameter of the through holes 388 is smaller than the inner diameter of the through holes 374 and slightly larger than the outer diameter of the drive wire 330. Therefore, the two axial ends of the through holes 374 are substantially sealed between the silicone ring 380 and silicone disk 386 serving as seal members. The inside of the through holes 374 are filled with dry air blown out from the blow hole 378. Note that some leakage occurs due to the clearance from the drive wire 330.

In the tray horizontal carrier 360 according to the present embodiment, since felt rings 382 or other moisture absorbing members are attached in the through holes 374 of the drive wire introduction members 372 in the chamber walls and the felt rings 382 slide over the outer periphery of the drive wire 330, they seal the through holes 374, prevent the inflow of outside air, improve the insulation, and function to wipe off condensation from the drive wire 33. Further, since a blow hole 378 for blowing out dry air is provided in the through hole 374 at the chamber inner side, the dry air blown from the blow hole 378 fills the inside of the through hole 374 and effectively prevents outside air from entering the inside of the through holes 374. As a result, the insulation is improved and the occurrence of condensation is suppressed. Further, the dry air blown out from the blow hole 378 also functions to dry off the moisture absorbed by the felt ring 382.

According to the in-chamber member movement mechanism according to the present embodiment, it is possible to realize an in-chamber member movement mechanism and electronic device testing apparatus with which it is easy to accurately stop a tray carrier or other movement member in the chamber section at a predetermined stopping position by a relatively simple mechanism, the load acting on the movement member is small, and there is less trouble. Further, it is possible to realize an in-chamber member movement mechanism and electronic device testing apparatus which can effectively prevent condensation when holding the inside of the chamber section at a low temperature state.

Note that the embodiments explained above were described to facilitate the understanding of the present invention and not to limit the present invention. Accordingly, elements disclosed in the above embodiments include all design modifications and equivalents belonging to the technical field of the present invention.

For example, in the above embodiments, an IC tester 1 of a type giving a thermal stress to the IC chips using the chamber body 301 was given as an example, but the electronic device tray according to the present invention may be used even for IC testers other than the so-called chamber type. Further, the electronic devices conveyed by the electronic device tray according to the present invention are not limited to IC chips.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic device tray transporting apparatus for transporting the tray in a substantially vertical direction, the tray holding at least one electronic device, comprising:
   a tray end holding member able to detachably hold an end of a lowermost level tray positioned at a lowermost level in the directly stacked trays;
   a tray elevating member for abutting against the bottom surface of the lowermost level tray and conveying the lowermost level tray downward or upward; and
   an actuator member for driving the tray end holding member so as to release the hold on the lowermost level tray by the tray end holding member and hold the end of another tray next arriving at the lowermost level position when the tray elevating member abuts against the bottom surface of the lowermost level tray and the lowermost level tray becomes supportable by the tray elevating member.

2. The electronic device tray transporting apparatus as set forth in claim 1, further comprising a tray horizontal carrier arranged below the tray end holding member so as not to interfere with the elevating movement of the tray elevating member, receiving the lowermost level tray when the tray elevating member descends, and able to move the same in the substantially horizontal direction.

3. The electronic device tray transporting apparatus as set forth in claim 2, further comprising a rail holding the tray horizontal carrier movably in the substantially horizontal direction.

4. The electronic device tray transporting apparatus as set forth in claim 2, further comprising a drive wire connected to the tray horizontal carrier for making the tray horizontal carrier move in the substantially horizontal direction.

5. The electronic device tray transporting apparatus as set forth in claim 4, further comprising a drive motor for winding up or unwinding the drive wire to make the tray horizontal carrier move along the substantially horizontal direction by the drive wire.

6. An electronic device tray transporting apparatus comprising:
   a tray horizontal carrier for conveying a tray holding at least one electronic device in a substantially horizontal direction, the tray horizontal carrier being movable within a chamber;
   a drive wire connected to the tray horizontal carrier for making the tray horizontal carrier move in the substantially horizontal direction; and
   a drive source arranged outside the chamber and linked with the drive wire so as to make the drive wire move along the longitudinal direction.

7. The electronic device tray transporting apparatus as set forth in claim 6, further comprising a rail for holding the tray horizontal carrier movably in the substantially horizontal direction.

8. The electronic device tray transporting apparatus as set forth in claim 6, further comprising a drive motor for winding up or unwinding the drive wire to make the tray horizontal carrier move along the substantially horizontal direction by the drive wire.

9. An in-chamber member movement mechanism comprising:
   a drive wire for driving a movement member arranged movably in a chamber section with an inside set to conditions different from the external environment;
   a drive source arranged outside the chamber section and linked with the drive wire so as to make the drive wire move along the longitudinal direction;
   a drive wire introduction member attached to a chamber wall and provided with a through hole through which the drive wire passes between the inside and outside of the chamber section; and
   a moisture absorbing member attached to the through hole of the drive wire introduction member and sliding over the outer periphery of the drive wire.

10. The in-chamber member movement mechanism as set forth in claim 9, wherein the drive wire introduction member is provided with a blow hole for blowing out dry air into the chamber inner side of the through hole of the drive wire introduction member.

11. The in-chamber member movement mechanism as set forth in claim 9, wherein the moisture absorbing member consists of a felt ring and is attached at the chamber outer side of the through hole.

12. The in-chamber member movement mechanism as set forth in claim 9, wherein the two ends of the through hole in the axial direction are provided with seal members substantially air-tightly sealing the inside of the through hole.

13. The in-chamber member movement mechanism as set forth in claim 9, wherein the movement member is a carrier for conveying a tray holding devices under test inside the chamber section.

14. An electronic device testing apparatus comprising:
   an electronic device tray including a tray body having a plate shape holder being provided at a surface of the tray body and respectively detachably holding electronic devices under test and a shutter attached movably with respect to the surface of the tray body for opening and closing an opening of the holder;
   an operating mechanism for making the shutter move with respect to the holder to open or close the opening;
   a tray movement mechanism for making the electronic device tray move;
   an electronic device transfer mechanism for picking and placing an electronic device in the holder in a state where the operating mechanism is used to make the shutter move and open the opening; and
   a chamber section having positioned inside it a measurement unit for testing the electronic device taken out by the electronic device transfer mechanism.

15. The electronic device testing apparatus as set forth in claim 14, wherein the operating mechanism has a drive mechanism which makes the shutter move with respect to the tray body in the state where the electronic device tray is stationary.

16. The electronic device testing apparatus as set forth in claim 14, wherein the operating mechanism is a stopper which catches on an engagement portion of the shutter and makes the shutter move relative to the tray body when the electronic device tray is made to move by the tray movement mechanism.

17. An electronic device testing apparatus comprising:
   a chamber section in which a measurement unit for testing electronic devices is positioned;
   a tray carrier arranged movably in the chamber section;
   a drive wire for driving the tray carrier;
   an electronic device tray arranged detachably with respect to the tray carrier; and
   an electronic device transfer mechanism for picking and placing an electronic device in the electronic device tray.

18. The electronic device tray transporting apparatus as set forth in claim 1, wherein a pair of tray end holding members are provided as the tray end holding member, the tray end holding members engaging opposed sides of a lowermost level tray in the stacked trays.

19. The electronic device tray transporting apparatus as set forth in claim 18, wherein the tray elevating member abuts against at least a central portion of the bottom surface of the lowermost level tray.

20. The electronic device tray transporting apparatus as set forth in claim 1, wherein the tray elevating member abuts against at least a central portion of the bottom surface of the lowermost level tray.

21. The electronic device tray transporting apparatus as set forth in claim 1, wherein the tray end holding member is pivotable about at least one axis by the actuator member, the at least one axis of the tray end holding member is at a fixed position relative to the lowermost level for the stacked trays.

22. The electronic device tray transporting apparatus as set forth in claim 1, further comprising a tray horizontal carrier positioned below the stacked trays, the tray elevating member lowers a tray from the stack and passes through the tray horizontal carrier to deposit the tray thereon.

23. The electronic device tray transporting apparatus as set forth in claim 6, wherein the drive wire is attached to opposed ends of the tray horizontal carrier and further comprising a drive source having a rotatable drum about which the drive wire is wound, the rotatable drum being driven by the drive source in order to move the tray horizontal carrier.

24. The electronic device tray transporting apparatus as set forth in claim 6, wherein the opening in the tray horizontal carrier is centrally located in the tray horizontal carrier.

25. The electronic device testing apparatus as set forth in claim 6, wherein the tray horizontal carrier has an opening through which a tray elevating member is passable in order to load or unload the tray horizontal carrier.

26. The electronic device testing apparatus as set forth in claim 14, wherein the holder is one of a plurality of holders provided on the tray, each of the holders having an opening for receiving electronic devices and wherein the shutter opens and closes the plurality of opening for the plurality of holders.

27. The electronic device tray as set forth in claim 14, wherein the tray body has a longitudinal axis and wherein the shutter is substantially parallel with and extends along the longitudinal axis of the tray body.

28. The electronic device testing apparatus as set forth in claim 17, further comprising:
 a drive source for the drive wire, the drive source being located outside of the chamber section;
 a drive wire introduction member attached to the chamber section, the drive wire introduction member being provided with a through hole through which the drive wire passes between the inside and the outside of the chamber section; and
 a moisture absorbing member attached to the through hole of the drive wire introduction member, the moisture absorbing member being in contact with the drive wire.

* * * * *